United States Patent
Low et al.

(10) Patent No.: US 10,122,214 B2
(45) Date of Patent: Nov. 6, 2018

(54) IMPEDANCE TRANSFORMATION NETWORK FOR IMPROVED DRIVER CIRCUIT PERFORMANCE

(71) Applicant: QUALCOMM Incorporated, San Diego, CA (US)

(72) Inventors: Zhen Ning Low, San Diego, CA (US); Charles Edward Wheatley, III, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 352 days.

(21) Appl. No.: 14/887,049

(22) Filed: Oct. 19, 2015

(65) Prior Publication Data
US 2016/0043574 A1 Feb. 11, 2016

Related U.S. Application Data

(63) Continuation of application No. 14/108,155, filed on Dec. 16, 2013, now Pat. No. 9,166,562, and a
(Continued)

(51) Int. Cl.
*H02J 50/12* (2016.01)
*H03H 11/28* (2006.01)
(Continued)

(52) U.S. Cl.
CPC .............. *H02J 50/12* (2016.02); *H02J 5/00* (2013.01); *H02J 5/005* (2013.01); *H02J 7/025* (2013.01);
(Continued)

(58) Field of Classification Search
CPC .. H02J 50/12; H02J 50/40; H02J 50/60; H02J 50/80; H02J 50/90; H02J 5/005; H02J 7/025; H02J 17/00
(Continued)

(56) References Cited

U.S. PATENT DOCUMENTS

| 4,833,420 A | 5/1989 | Ramet |
| 5,129,006 A | 7/1992 | Hill et al. |

(Continued)

FOREIGN PATENT DOCUMENTS

| CN | 101933031 A | 12/2010 |
| CN | 101945498 A | 1/2011 |

(Continued)

OTHER PUBLICATIONS

Van Bezooijen, A.V., et al., "Adaptive Impedance-Matching Techniques for Controlling L Networks", Circuits and Systems I: Regular Papers, IEEE Transactions on; vol. 57, Issue: 2; Digital Object Identifier: 10.1 109/TCSI.2009.2023764 Feb. 2010, pp. 495-505.

(Continued)

*Primary Examiner* — John Poos
(74) *Attorney, Agent, or Firm* — Knobbe, Martens, Olson & Bear, LLP

(57) ABSTRACT

This disclosure provides systems, methods and apparatus for reducing harmonic emissions. One aspect of the disclosure provides a transmitter apparatus. The transmitter apparatus includes a driver circuit characterized by an efficiency and a power output level. The driver circuit further includes a filter circuit electrically connected to the driver circuit and configured to modify the impedance of the transmit circuit to maintain the efficiency of the driver circuit at a level that is within 20% of a maximum efficiency of the driver circuit when the impedance is within the complex impedance range. The filter circuit is further configured to maintain a substantially constant power output level irrespective of the reactive variations within the complex impedance range. The filter circuit is further configured to maintain a substantially linear relationship between the power output level and the resistive variations within the impedance range.

29 Claims, 23 Drawing Sheets

Related U.S. Application Data continuation-in-part of application No. 13/424,834, filed on Mar. 20, 2012.

(60) Provisional application No. 61/769,152, filed on Feb. 25, 2013, provisional application No. 61/467,853, filed on Mar. 25, 2011, provisional application No. 61/550,219, filed on Oct. 21, 2011.

(51) Int. Cl.
| | |
|---|---|
| H03H 3/00 | (2006.01) |
| H02J 5/00 | (2016.01) |
| H02J 50/90 | (2016.01) |
| H02J 50/80 | (2016.01) |
| H02J 50/60 | (2016.01) |
| H02J 50/40 | (2016.01) |
| H04B 5/00 | (2006.01) |
| H02J 7/02 | (2016.01) |
| H02J 17/00 | (2006.01) |
| H03H 7/38 | (2006.01) |

(52) U.S. Cl.
CPC .............. *H02J 17/00* (2013.01); *H02J 50/40* (2016.02); *H02J 50/60* (2016.02); *H02J 50/80* (2016.02); *H02J 50/90* (2016.02); *H03H 3/00* (2013.01); *H03H 7/38* (2013.01); *H03H 11/28* (2013.01); *H04B 5/0037* (2013.01); *Y02D 70/00* (2018.01); *Y02D 70/144* (2018.01); *Y02D 70/162* (2018.01); *Y02D 70/166* (2018.01); *Y10T 29/49016* (2015.01)

(58) Field of Classification Search
USPC ........................................................ 307/104
See application file for complete search history.

(56) References Cited

U.S. PATENT DOCUMENTS

| | | | |
|---|---|---|---|
| 5,535,438 | A | 7/1996 | Sevic |
| 5,610,553 | A | 3/1997 | Kirn |
| 6,236,847 | B1 | 5/2001 | Stikvoort |
| 6,344,780 | B1 | 2/2002 | Dobashi et al. |
| 7,092,691 | B2 | 8/2006 | Bohn et al. |
| 7,639,993 | B1 | 12/2009 | Shumarayev et al. |
| 7,791,413 | B2 | 9/2010 | Catoiu et al. |
| 7,834,813 | B2 | 11/2010 | Caimi et al. |
| 8,400,017 | B2 | 3/2013 | Kurs et al. |
| 2002/0172458 | A1 | 11/2002 | Downie |
| 2004/0075492 | A1 | 4/2004 | Wight |
| 2005/0029351 | A1 | 2/2005 | Yoshinaga et al. |
| 2005/0179505 | A1 | 8/2005 | Di Giandomenico et al. |
| 2006/0068749 | A1 | 3/2006 | Ismail et al. |
| 2009/0096533 | A1 | 4/2009 | Paul et al. |
| 2010/0109445 | A1 | 5/2010 | Kurs et al. |
| 2010/0277003 | A1 | 11/2010 | Von Novak et al. |
| 2010/0321165 | A1 | 12/2010 | Lee |
| 2011/0057607 | A1 | 3/2011 | Carobolante |
| 2011/0133570 | A1 | 6/2011 | Mayo et al. |
| 2011/0201276 | A1 | 8/2011 | Forsell |
| 2011/0217926 | A1* | 9/2011 | Low ................... H04B 5/0081 455/41.1 |
| 2012/0155344 | A1 | 6/2012 | Wiley et al. |
| 2012/0223590 | A1 | 9/2012 | Low et al. |
| 2012/0242284 | A1* | 9/2012 | Wheatley, III .......... H02J 17/00 320/108 |
| 2013/0033118 | A1 | 2/2013 | Karalis et al. |
| 2013/0038136 | A1 | 2/2013 | Wheatley et al. |
| 2013/0039395 | A1 | 2/2013 | Norconk et al. |
| 2014/0240057 | A1 | 8/2014 | Low et al. |

FOREIGN PATENT DOCUMENTS

| | | |
|---|---|---|
| CN | 102714429 A | 10/2012 |
| EP | 1494162 A2 | 1/2005 |
| EP | 1796016 A2 | 6/2007 |
| EP | 2528193 A1 | 11/2012 |
| FR | 2806563 A1 | 9/2001 |
| JP | H098576 A | 1/1997 |
| JP | 2001238372 A | 8/2001 |
| JP | 2003008384 A | 1/2003 |
| JP | 2005026741 A | 1/2005 |
| JP | 2007274247 A | 10/2007 |
| JP | 2007281573 A | 10/2007 |
| WO | WO-9531037 A1 | 11/1995 |
| WO | WO-2004036736 A1 | 4/2004 |
| WO | WO-2007031852 A1 | 3/2007 |
| WO | WO-2011028956 A2 | 3/2011 |
| WO | WO-2011032048 A1 | 3/2011 |

OTHER PUBLICATIONS

Taiwan Search Report—TW105116322—TIPO—dated Dec. 14, 2016.

Imbornone, J., et al., "A Novel Technique for the Design of High Efficiency Power Amplifiers", 24th European Microwave Conference, Sep. 5-8, 1994, Nexus Business Communications, GB, vol. 2, Sep. 5, 1994 (Sep. 5, 1994), pp. 1154-1159, XP000678207.

International Search Report and Written Opinion—PCT/US2014/016191—ISA/IPO—dated Jul. 16, 2014.

Raab, "Effects of Circuit Variations on the class E Tuned Power Amplifier", IEEE Journal of Solid State Circuits, vol. SC-13, No. 2, 1978, pp. 9.

Saad, P., et al., "Design of a Highly Efficient 2-4-GHz Octave Bandwidth GaN-HEMT Power Amplifier", IEEE Transactions on Microwave Theory and Techniques, IEEE Service Center, Iscataway, NJ, US, vol. 58, No. 7, Jul. 1, 2010 (Jul. 1, 2010), pp. 1677-1685, XP01131 0406, ISSN: 0018-9480.

Tu S H-J., "Class E RF tuned power amplifiers in CMOS technologies: theory and circuit design considerations", IEEE Communications Magazine, IEEE Service Center, Piscataway, US, vol. 42, No. 9, Sep. 1, 2004 (Sep. 1, 2004), pp. S6-S11, XP011119463.

Taiwan Search Report—TW103106307—TIPO—dated Feb. 18, 2016.

\* cited by examiner

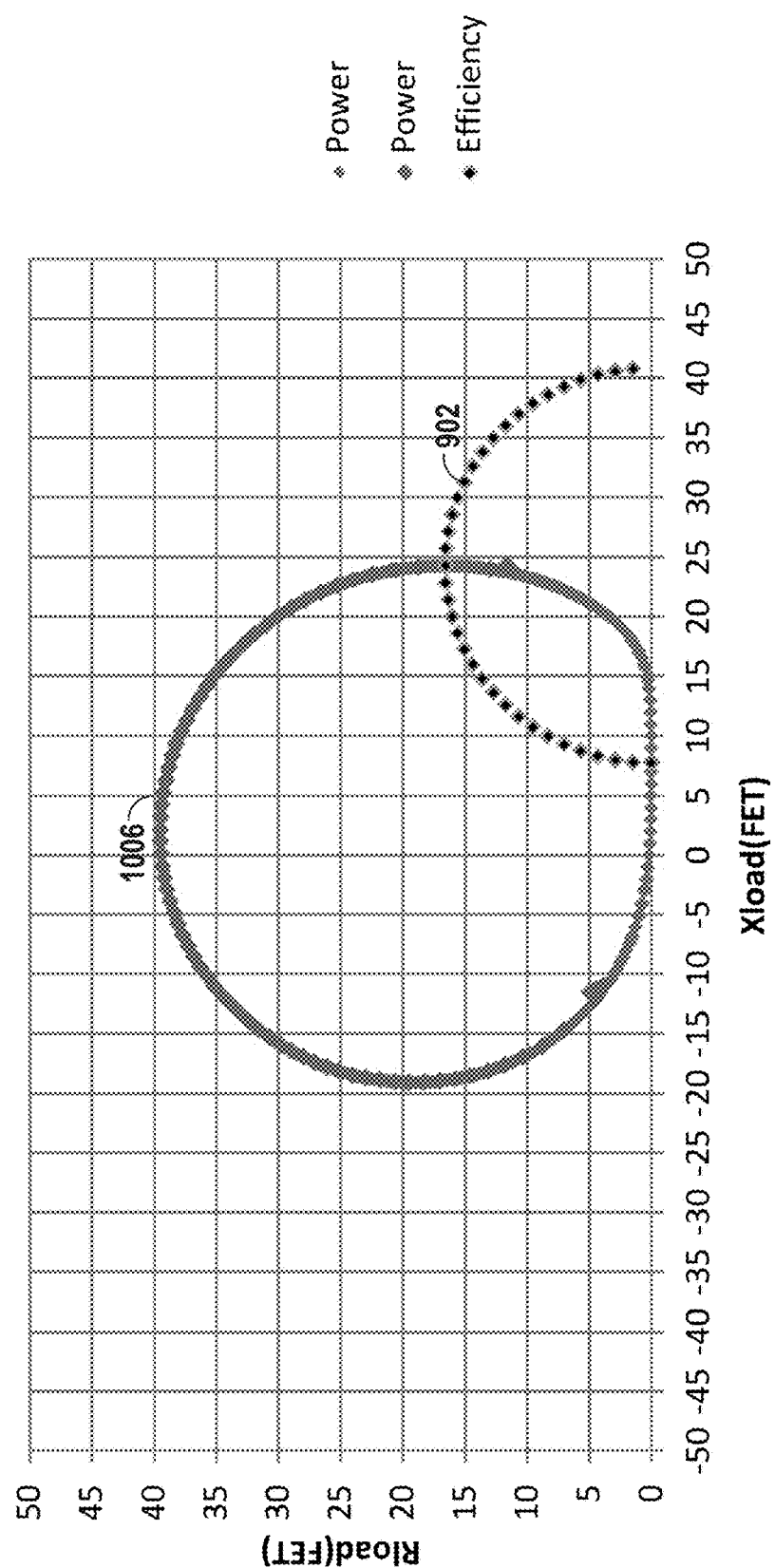

IMPEDANCE TRANSFORMATION NETWORK FOR IMPROVED DRIVER CIRCUIT PERFORMANCE

CROSS REFERENCE TO RELATED APPLICATIONS

This application is a continuation of U.S. application Ser. No. 14/108,155, filed Dec. 16, 2013 which claims priority to Provisional Application No. 61/769,152, entitled "IMPEDANCE TRANSFORMATION NETWORK FOR IMPROVED DRIVER CIRCUIT PERFORMANCE," filed Feb. 25, 2013, each of which is hereby expressly incorporated by reference herein. This application is a continuation-in-part of U.S. patent application Ser. No. 13/424,834 entitled "FILTER FOR IMPROVED DRIVER CIRCUIT EFFICIENCY AND METHOD OF OPERATION" filed Mar. 20, 2012, which is hereby incorporated by reference herein, and which claims priority to Provisional Application No. 61/467,853, filed Mar. 25, 2011; and to Provisional Application No. 61/550,219, filed Oct. 21, 2011. This application is related to U.S. patent application Ser. No. 13/625,813 entitled "FILTER FOR IMPROVED DRIVER CIRCUIT EFFICIENCY AND METHOD OF OPERATION" filed Sep. 24, 2012, which is hereby incorporated by reference in its entirety.

FIELD

The present invention relates generally to wireless power. More specifically, the disclosure is directed to improving the efficiency and power output of transmit circuit driving a load varying over a wide resistive and reactive range.

BACKGROUND

An increasing number and variety of electronic devices are powered via rechargeable batteries. Such devices include mobile phones, portable music players, laptop computers, tablet computers, computer peripheral devices, communication devices (e.g., Bluetooth devices), digital cameras, hearing aids, and the like. While battery technology has improved, battery-powered electronic devices increasingly require and consume greater amounts of power. As such, these devices constantly require recharging. Rechargeable devices are often charged via wired connections that require cables or other similar connectors that are physically connected to a power supply. Cables and similar connectors may sometimes be inconvenient or cumbersome and have other drawbacks. Wireless charging systems that are capable of transferring power in free space to be used to charge rechargeable electronic devices may overcome some of the deficiencies of wired charging solutions. As such, wireless charging systems and methods that efficiently and safely transfer power for charging rechargeable electronic devices are desirable.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the subject matter described in the disclosure provides a transmitter apparatus. The transmitter apparatus includes a driver circuit characterized by an efficiency and a power output level. The driver circuit is electrically connected to a transmit circuit having an impedance. The impedance of the transmit circuit is within a complex impedance range including resistive and reactive variations. The complex impedance range is defined by a minimum real impedance value, a maximum real impedance, a minimum imaginary impedance value, and a maximum imaginary impedance value. A ratio between the minimum and maximum real impedance value is at least two to one. A magnitude of the difference between the maximum and minimum imaginary impedance values being at least twice a magnitude of the difference between the minimum and maximum real impedance values. The transmitter apparatus further includes a filter circuit electrically connected to the driver circuit and configured to modify the impedance of the transmit circuit to maintain the efficiency of the driver circuit at a level that is within 20% of a maximum efficiency of the driver circuit when the impedance is within the complex impedance range. The filter circuit is further configured to maintain a substantially constant power output level irrespective of the reactive variations within the complex impedance range. The filter circuit is further configured to maintain a substantially linear relationship between the power output level and the resistive variations within the complex impedance range.

Another aspect of the subject matter described in the disclosure provides a transmitter apparatus. The transmitter apparatus includes a driver circuit including a switching amplifier circuit comprising a switch, a switch shunt capacitor, and a series inductor electrically connected to the output of the driver circuit. The transmitter apparatus further includes a transmit circuit including a coil having an inductance electrically connected in series to a capacitor to form a resonant circuit. The transmitter apparatus further includes a filter circuit electrically connected between the driver circuit and the transmit circuit, the filter circuit comprising solely of a single shunt capacitor network.

Yet another aspect of the subject matter described in the disclosure provides a method of selecting component values of one or more reactive components of a filter circuit for a wireless power transmitter device. The filter circuit is electrically connected between a driver circuit and a transmit circuit. The method includes determining a first set of complex impedance values for which efficiency of the driver circuit is above a threshold. The first set of complex impedance values substantially map to complex impedance values along a half circle path. The method further includes determining a second set of complex impedance values for which power output of the driver circuit is substantially constant. The second set of complex impedance values substantially map to values along a full circle path that is orthogonal to the half circle and which crosses the half circle at a maximum. The method further includes selecting the component values to provide an impedance transformation that modifies a variable complex impedance of the transmit circuit to complex impedance values derived from the first and second sent of complex impedance values.

Another aspect of the subject matter described in the disclosure provides a transmitter apparatus. The transmitter apparatus includes a driver circuit characterized by an efficiency and a power output level. The driver circuit is electrically connected to a transmit circuit having an impedance. The impedance of the transmit circuit is within a complex impedance range including resistive and reactive variations. The transmitter apparatus further includes a filter circuit electrically connected to the driver circuit and configured to modify the impedance of the transmit circuit. The filter circuit has one or more reactive components with values selected derived from a first value and a second value. The first value, Rd, corresponds to a radius of a half circle. The half circle is defined by a set of complex impedance values along the perimeter of the half circle that correspond to values for which efficiency of the driver circuit is at least within 20% of the maximum efficiency of the driver circuit. The second value R0, corresponds to a real impedance value at the load of the filter circuit that results in a desired transformed impedance being equal to Rd at an input of the filter circuit.

BRIEF DESCRIPTION OF THE DRAWINGS

FIG. 10B is another plot showing a selected power output contour and a maximum efficiency contour for a driver circuit as in FIG. 7 as a function of real and imaginary components of the load impedance presented to the driver circuit.

Figure 1:
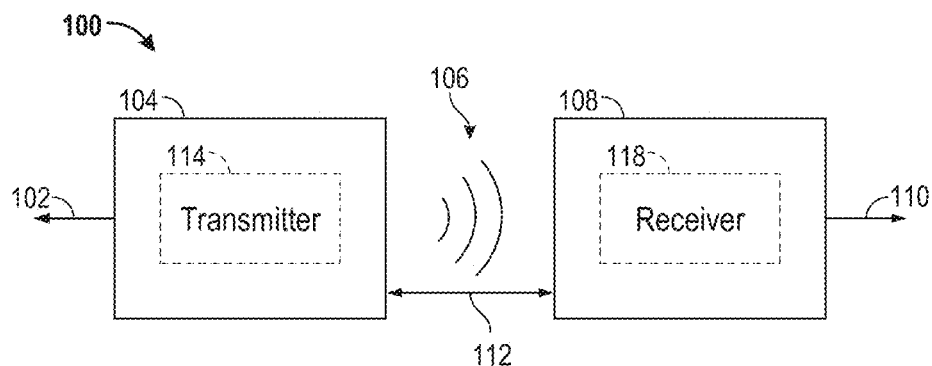
FIG. 1 is a functional block diagram of an exemplary wireless power transfer system, in accordance with exemplary embodiments of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments of the invention and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. The exemplary embodiments of the invention may be practiced without these specific details. In some instances, well-known structures and devices are shown in block diagram form in order to avoid obscuring the novelty of the exemplary embodiments presented herein.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving coil" to achieve power transfer.

FIG. 1 is a functional block diagram of an exemplary wireless power transfer system 100, in accordance with exemplary embodiments of the invention. Input power 102 may be provided to a transmitter 104 from a power source (not shown) for generating a field 106 for providing energy transfer. A receiver 108 may couple to the field 106 and generate output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship. When the resonant frequency of receiver 108 and the resonant frequency of transmitter 104 are substantially the same or very close, transmission losses between the transmitter 104 and the receiver 108 are minimal. As such, wireless power transfer may be provided over larger distance in contrast to purely inductive solutions that may require large coils that require coils to be very close (e.g., mms). Resonant inductive coupling techniques may thus allow for improved efficiency and power transfer over various distances and with a variety of inductive coil configurations.

The receiver 108 may receive power when the receiver 108 is located in an energy field 106 produced by the transmitter 104. The field 106 corresponds to a region where energy output by the transmitter 104 may be captured by a receiver 106. In some cases, the field 106 may correspond to the "near-field" of the transmitter 104 as will be further described below.

The transmitter 104 may include a transmit coil 114 for outputting an energy transmission. The receiver 108 further includes a receive coil 118 for receiving or capturing energy from the energy transmission. The near-field may correspond to a region in which there are strong reactive fields resulting from the currents and charges in the transmit coil 114 that minimally radiate power away from the transmit coil 114. In some cases the near-field may correspond to a region that is within about one wavelength (or a fraction thereof) of the transmit coil 114. The transmit and receive coils 114 and 118 are sized according to applications and devices to be associated therewith. As described above, efficient energy transfer may occur by coupling a large portion of the energy in a field 106 of the transmit coil 114 to a receive coil 118 rather than propagating most of the energy in an electromagnetic wave to the far field. When positioned within the field 106, a "coupling mode" may be developed between the transmit coil 114 and the receive coil 118. The area around the transmit and receive coils 114 and 118 where this coupling may occur is referred to herein as a coupling-mode region.

Figure 2:
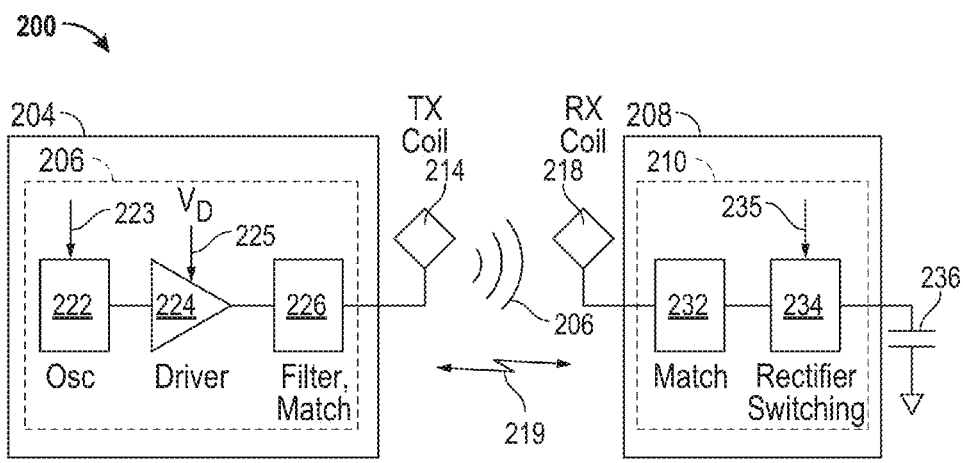
FIG. 2 is a functional block diagram of exemplary components that may be used in the wireless power transfer system of FIG. 1, in accordance with various exemplary embodiments of the invention.

FIG. 2 is a functional block diagram of exemplary components that may be used in the wireless power transfer system 100 of FIG. 1, in accordance with various exemplary embodiments of the invention. The transmitter 204 may include transmit circuitry 206 that may include an oscillator 222, a driver circuit 224, and a filter and impedance transforming circuit 226. The oscillator 222 may be configured to generate a signal at a desired frequency, such as 468.75 KHz, 6.78 MHz or 13.56 MHz, that may be adjusted in response to a frequency control signal 223. The oscillator signal may be provided to a driver circuit 224 configured to drive the transmit coil 214 at, for example, a resonant frequency of the transmit coil 214. The driver circuit 224 may be a switching amplifier configured to receive a square wave from the oscillator 222 and output a sine wave. For example, the driver circuit 224 may be a class E amplifier. A filter and impedance transforming circuit 226 may be also included to filter out harmonics or other unwanted frequencies and match the impedance of the transmitter 204 to the transmit coil 214. The filter and impedance transforming circuit 226 may be configured to perform a variety of impedance adjustments other than just matching the impedance of the transmitter 204 to the transmit coil 214.

The receiver 208 may include receive circuitry 210 that may include a matching circuit 232 (or any other type of impedance adjustment circuit) and a rectifier and switching circuit 234 to generate a DC power output from an AC power input to charge a battery 236 as shown in FIG. 2 or to power a device (not shown) coupled to the receiver 108. The matching circuit 232 may be included to match the impedance of the receive circuitry 210 to the receive coil 218. The receiver 208 and transmitter 204 may additionally communicate on a separate communication channel 219 (e.g., Bluetooth, zigbee, cellular, etc.). The receiver 208 and transmitter 204 may alternatively communicate via in-band signaling using characteristics of the wireless field 206.

Figure 3:
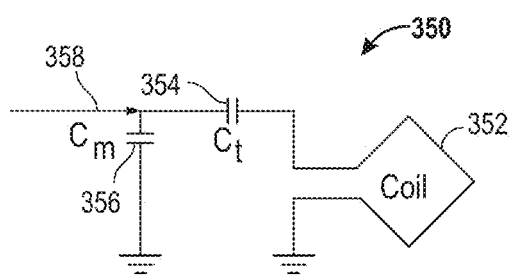
FIG. 3 is a schematic diagram of a portion of transmit circuitry or receive circuitry of FIG. 2 including a transmit or receive coil, in accordance with exemplary embodiments of the invention.

As described more fully below, receiver 208, that may initially have a selectively disablable associated load (e.g., battery 236), may be configured to determine whether an amount of power transmitted by transmitter 204 and received by receiver 208 is appropriate for charging a battery 236. Further, receiver 208 may be configured to enable a load (e.g., battery 236) upon determining that the amount of power is appropriate. In some embodiments, a receiver 208 may be configured to directly utilize power received from a wireless power transfer field without charging of a battery 236. For example, a communication device, such as a near-field communication (NFC) or radio-frequency identification device (RFID) may be configured to receive power from a wireless power transfer field and communicate by interacting with the wireless power transfer field and/or utilize the received power to communicate with a transmitter 204 or other devices FIG. 3 is a schematic diagram of a portion of transmit circuitry or receive circuitry of FIG. 2 including a transmit or receive coil 352, in accordance with exemplary embodiments of the invention. As illustrated in FIG. 3, transmit circuitry 350 used in exemplary embodiments may include a coil 352. The coil may also be referred to or be configured as a "loop" antenna 352. The coil 352 may also be referred to herein or configured as a "magnetic" antenna or an induction coil. The term "coil" is intended to refer to a component that may wirelessly output or receive energy for coupling to another "coil." The coil may also be referred to as an "antenna" of a type that is configured to wirelessly output or receive power. The coil may also be referred to as a wireless power transfer component of a type that is configured to wirelessly transmit or receive power. The coil 352 may be configured to include an air core or a physical core such as a ferrite core (not shown).

As stated, efficient transfer of energy between the transmitter 104 and receiver 108 may occur during matched or nearly matched resonance between the transmitter 104 and the receiver 108. However, even when resonance between the transmitter 104 and receiver 108 are not matched, energy may be transferred, although the efficiency may be affected.

Transfer of energy occurs by coupling energy from the field 106 of the transmitting coil to the receiving coil residing in the neighborhood where this field 106 is established rather than propagating the energy from the transmitting coil into free space.

The resonant frequency of the loop or magnetic coils is based on the inductance and capacitance. Inductance may be simply the inductance created by the coil 352, whereas, capacitance may be added to the coil's inductance to create a resonant structure at a desired resonant frequency. As a non-limiting example, capacitor 354 and capacitor 356 may be added to the transmit circuitry 350 to create a resonant circuit that selects a signal 358 at a resonant frequency. Accordingly, for larger diameter coils, the size of capacitance needed to sustain resonance may decrease as the diameter or inductance of the loop increases. Furthermore, as the diameter of the coil increases, the efficient energy transfer area of the near-field may increase. Other resonant circuits formed using other components are also possible. As another non-limiting example, a capacitor may be placed in parallel between the two terminals of the coil 350. For transmit coils, a signal 358 with a frequency that substantially corresponds to the resonant frequency of the coil 352 may be an input to the coil 352.

In one embodiment, the transmitter 104 (FIG. 1) may be configured to output a time varying magnetic field with a frequency corresponding to the resonant frequency of the transmit coil 114. When the receiver is within the field 106, the time varying magnetic field may induce a current in the receive coil 118. As described above, if the receive coil 118 is configured to be resonant at the frequency of the transmit coil 118, energy may be efficiently transferred. The AC signal induced in the receive coil 118 may be rectified as described above to produce a DC signal that may be provided to charge or to power a load.

Figure 4:
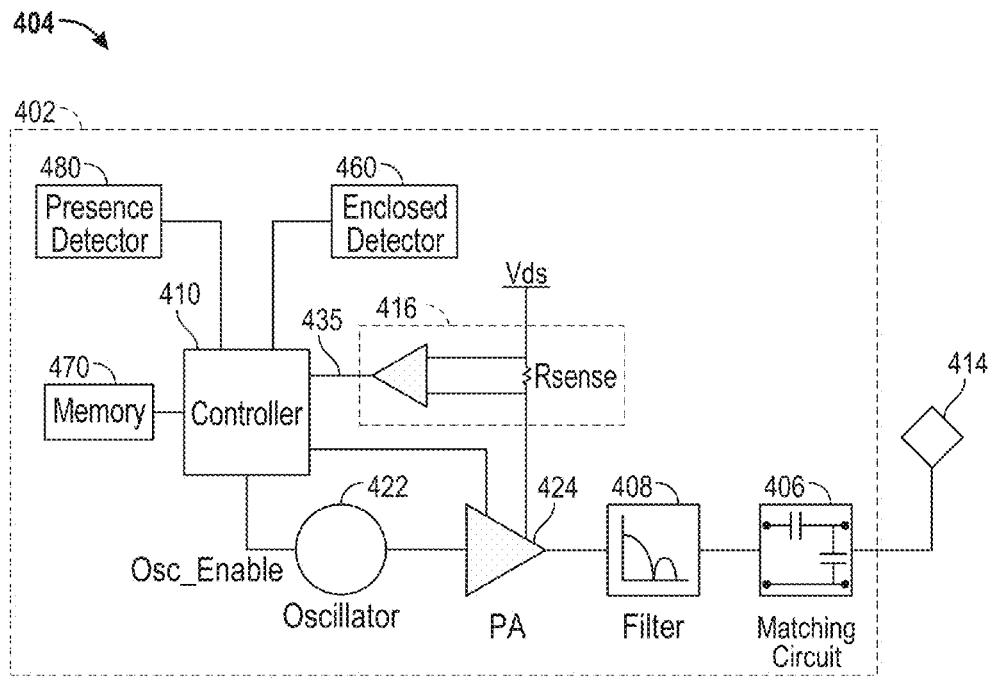
FIG. 4 is a functional block diagram of a transmitter that may be used in the wireless power transfer system of FIG. 1, in accordance with exemplary embodiments of the invention.

FIG. 4 is a functional block diagram of a transmitter 404 that may be used in the wireless power transfer system of FIG. 1, in accordance with exemplary embodiments of the invention. The transmitter 404 may include transmit circuitry 406 and a transmit coil 414. The transmit coil 414 may be the coil 352 as shown in FIG. 3. Transmit circuitry 406 may provide RF power to the transmit coil 414 by providing an oscillating signal resulting in generation of energy (e.g., magnetic flux) about the transmit coil 414. Transmitter 404 may operate at any suitable frequency. By way of example, transmitter 404 may operate at the 6.78 MHz ISM band.

Transmit circuitry 406 may include a fixed impedance matching circuit 406 for matching the impedance of the transmit circuitry 406 (e.g., 50 ohms) to the transmit coil 414 and a low pass filter (LPF) 408 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that may be varied based on measurable transmit metrics, such as output power to the coil 414 or DC current drawn by the driver circuit 424. Transmit circuitry 406 further includes a driver circuit 424 configured to drive an RF signal as determined by an oscillator 422. The transmit circuitry 406 may be comprised of discrete devices or circuits, or alternately, may be comprised of an integrated assembly. An exemplary RF power output from transmit coil 414 may be on the order of 2.5 Watts.

Transmit circuitry 406 may further include a controller 410 for selectively enabling the oscillator 422 during transmit phases (or duty cycles), for adjusting the frequency or phase of the oscillator 422, and for adjusting the output power level for implementing a communication protocol for interacting with neighboring devices through their attached receivers. It is noted that the controller 410 may also be referred to herein as processor 410. Adjustment of oscillator phase and related circuitry in the transmission path may allow for reduction of out of band emissions.

The transmit circuitry 406 may further include a load sensing circuit 416 for detecting the presence or absence of active receivers in the vicinity of the near-field generated by transmit coil 414. By way of example, a load sensing circuit 416 monitors the current flowing to the driver circuit 424, that may be affected by the presence or absence of active receivers in the vicinity of the field generated by transmit coil 414 as will be further described below. Detection of changes to the loading on the driver circuit 424 are monitored by controller 410 for use in determining whether to enable the oscillator 422 for transmitting energy and to communicate with an active receiver. As described more fully below, a current measured at the driver circuit 424 may be used to determine whether an invalid device is positioned within a wireless power transfer region of the transmitter 404.

The transmit coil 414 may be implemented with a Litz wire or as an antenna strip with the thickness, width and metal type selected to keep resistive losses low. In a one implementation, the transmit coil 414 may generally be configured for association with a larger structure such as a table, mat, lamp or other less portable configuration. Accordingly, the transmit coil 414 generally may not need "turns" in order to be of a practical dimension. An exemplary implementation of a transmit coil 414 may be "electrically small" (i.e., fraction of the wavelength) and tuned to resonate at lower usable frequencies by using capacitors to define the resonant frequency.

The transmitter 404 may gather and track information about the whereabouts and status of receiver devices that may be associated with the transmitter 404. Thus, the transmitter circuitry 404 may include a presence detector 480, an enclosed detector 460, or a combination thereof, connected to the controller 410 (also referred to as a processor herein). The controller 410 may adjust an amount of power delivered by the driver circuit 424 in response to presence signals from the presence detector 480 and the enclosed detector 460. The transmitter 404 may receive power through a number of power sources, such as, for example, an AC-DC converter (not shown) to convert conventional AC power present in a building, a DC-DC converter (not shown) to convert a conventional DC power source to a voltage suitable for the transmitter 404, or directly from a conventional DC power source (not shown).

As a non-limiting example, the presence detector 480 may be a motion detector utilized to sense the initial presence of a device to be charged that is inserted into the coverage area of the transmitter 404. After detection, the transmitter 404 may be turned on and the RF power received by the device may be used to toggle a switch on the Rx device in a pre-determined manner, which in turn results in changes to the driving point impedance of the transmitter 404.

As another non-limiting example, the presence detector 480 may be a detector capable of detecting a human, for example, by infrared detection, motion detection, or other suitable means. In some exemplary embodiments, there may be regulations limiting the amount of power that a transmit coil 414 may transmit at a specific frequency. In some cases, these regulations are meant to protect humans from electromagnetic radiation. However, there may be environments where a transmit coil 414 is placed in areas not occupied by humans, or occupied infrequently by humans, such as, for example, garages, factory floors, shops, and the like. If these environments are free from humans, it may be permissible to increase the power output of the transmit coil 414 above the normal power restrictions regulations. In other words, the controller 410 may adjust the power output of the transmit coil 414 to a regulatory level or lower in response to human presence and adjust the power output of the transmit coil 414 to a level above the regulatory level when a human is outside a regulatory distance from the electromagnetic field of the transmit coil 414.

As a non-limiting example, the enclosed detector 460 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In exemplary embodiments, a method by which the transmitter 404 does not remain on indefinitely may be used. In this case, the transmitter 404 may be programmed to shut off after a user-determined amount of time. This feature prevents the transmitter 404, notably the driver circuit 424, from running long after the wireless devices in its perimeter are fully charged. This event may be due to the failure of the circuit to detect the signal sent from either the repeater or the receive coil that a device is fully charged. To prevent the transmitter 404 from automatically shutting down if another device is placed in its perimeter, the transmitter 404 automatic shut off feature may be activated only after a set period of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
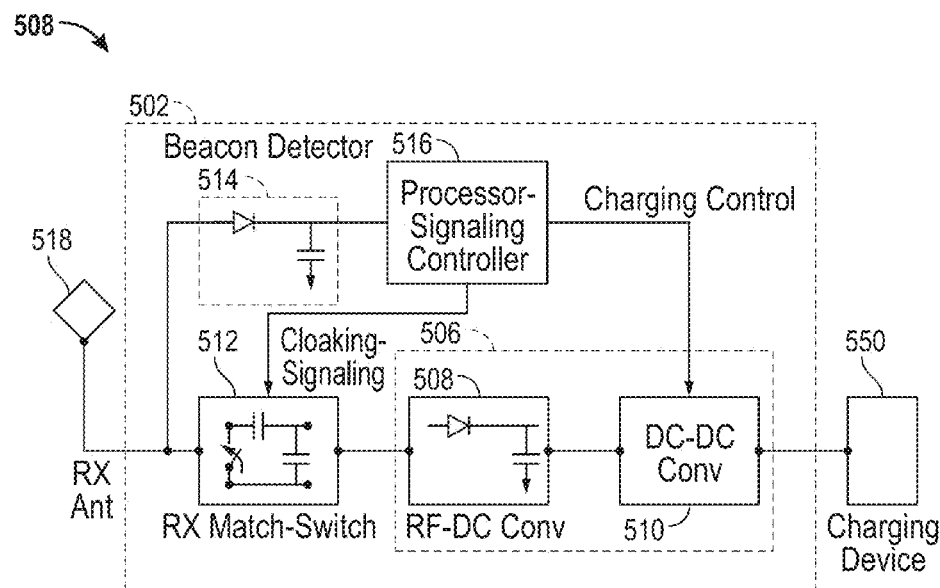
FIG. 5 is a functional block diagram of a receiver that may be used in the wireless power transfer system of FIG. 1, in accordance with exemplary embodiments of the invention.

FIG. 5 is a functional block diagram of a receiver 508 that may be used in the wireless power transfer system of FIG. 1, in accordance with exemplary embodiments of the invention. The receiver 508 includes receive circuitry 510 that may include a receive coil 518. Receiver 508 further couples to device 550 for providing received power thereto. It should be noted that receiver 508 is illustrated as being external to device 550 but may be integrated into device 550. Energy may be propagated wirelessly to receive coil 518 and then coupled through the rest of the receive circuitry 510 to device 550. By way of example, the charging device may include devices such as mobile phones, portable music players, laptop computers, tablet computers, computer peripheral devices, communication devices (e.g., Bluetooth devices), digital cameras, hearing aids (and other medical devices), and the like.

Receive coil 518 may be tuned to resonate at the same frequency, or within a specified range of frequencies, as transmit coil 414 (FIG. 4). Receive coil 518 may be similarly dimensioned with transmit coil 414 or may be differently sized based upon the dimensions of the associated device 550. By way of example, device 550 may be a portable electronic device having diametric or length dimension smaller that the diameter of length of transmit coil 414. In such an example, receive coil 518 may be implemented as a multi-turn coil in order to reduce the capacitance value of a tuning capacitor (not shown) and increase the receive coil's impedance. By way of example, receive coil 518 may be placed around the substantial circumference of device 550 in order to maximize the coil diameter and reduce the number of loop turns (i.e., windings) of the receive coil 518 and the inter-winding capacitance.

Receive circuitry 510 may provide an impedance match to the receive coil 518. Receive circuitry 510 includes power conversion circuitry 506 for converting a received RF energy source into charging power for use by the device 550. Power conversion circuitry 506 includes an RF-to-DC converter 508 and may also in include a DC-to-DC converter 510. RF-to-DC converter 508 rectifies the RF energy signal received at receive coil 518 into a non-alternating power with an output voltage represented by $V_{rect}$. The DC-to-DC converter 510 (or other power regulator) converts the rectified RF energy signal into an energy potential (e.g., voltage) that is compatible with device 550 with an output voltage and output current represented by $V_{out}$ and $I_{out}$. Various RF-to-DC converters are contemplated, including partial and full rectifiers, regulators, bridges, doublers, as well as linear and switching converters.

Receive circuitry 510 may further include switching circuitry 512 for connecting receive coil 518 to the power conversion circuitry 506 or alternatively for disconnecting the power conversion circuitry 506. Disconnecting receive coil 518 from power conversion circuitry 506 not only suspends charging of device 550, but also changes the "load" as "seen" by the transmitter 404 (FIG. 2).

As disclosed above, transmitter 404 includes load sensing circuit 416 that may detect fluctuations in the bias current provided to transmitter power driver circuit 410. Accordingly, transmitter 404 has a mechanism for determining when receivers are present in the transmitter's near-field.

When multiple receivers 508 are present in a transmitter's near-field, it may be desirable to time-multiplex the loading and unloading of one or more receivers to enable other receivers to more efficiently couple to the transmitter. A receiver 508 may also be cloaked in order to eliminate coupling to other nearby receivers or to reduce loading on nearby transmitters. This "unloading" of a receiver is also known herein as a "cloaking." Furthermore, this switching between unloading and loading controlled by receiver 508 and detected by transmitter 404 may provide a communication mechanism from receiver 508 to transmitter 404 as is explained more fully below. Additionally, a protocol may be associated with the switching that enables the sending of a message from receiver 508 to transmitter 404. By way of example, a switching speed may be on the order of 100 μsec.

In an exemplary embodiment, communication between the transmitter 404 and the receiver 508 refers to a device sensing and charging control mechanism, rather than conventional two-way communication (i.e., in band signaling using the coupling field). In other words, the transmitter 404 may use on/off keying of the transmitted signal to adjust whether energy is available in the near-field. The receiver may interpret these changes in energy as a message from the transmitter 404. From the receiver side, the receiver 508 may use tuning and de-tuning of the receive coil 518 to adjust how much power is being accepted from the field. In some cases, the tuning and de-tuning may be accomplished via the switching circuitry 512. The transmitter 404 may detect this difference in power used from the field and interpret these changes as a message from the receiver 508. It is noted that other forms of modulation of the transmit power and the load behavior may be utilized.

Receive circuitry 510 may further include signaling detector and beacon circuitry 514 used to identify received energy fluctuations, that may correspond to informational signaling from the transmitter to the receiver. Furthermore, signaling and beacon circuitry 514 may also be used to detect the transmission of a reduced RF signal energy (i.e., a beacon signal) and to rectify the reduced RF signal energy into a nominal power for awakening either un-powered or power-depleted circuits within receive circuitry 510 in order to configure receive circuitry 510 for wireless charging.

Receive circuitry 510 further includes processor 516 for coordinating the processes of receiver 508 described herein including the control of switching circuitry 512 described herein. Cloaking of receiver 508 may also occur upon the occurrence of other events including detection of an external wired charging source (e.g., wall/USB power) providing charging power to device 550. Processor 516, in addition to controlling the cloaking of the receiver, may also monitor beacon circuitry 514 to determine a beacon state and extract messages sent from the transmitter 404. Processor 516 may also adjust the DC-to-DC converter 510 for improved performance.

Figure 6:
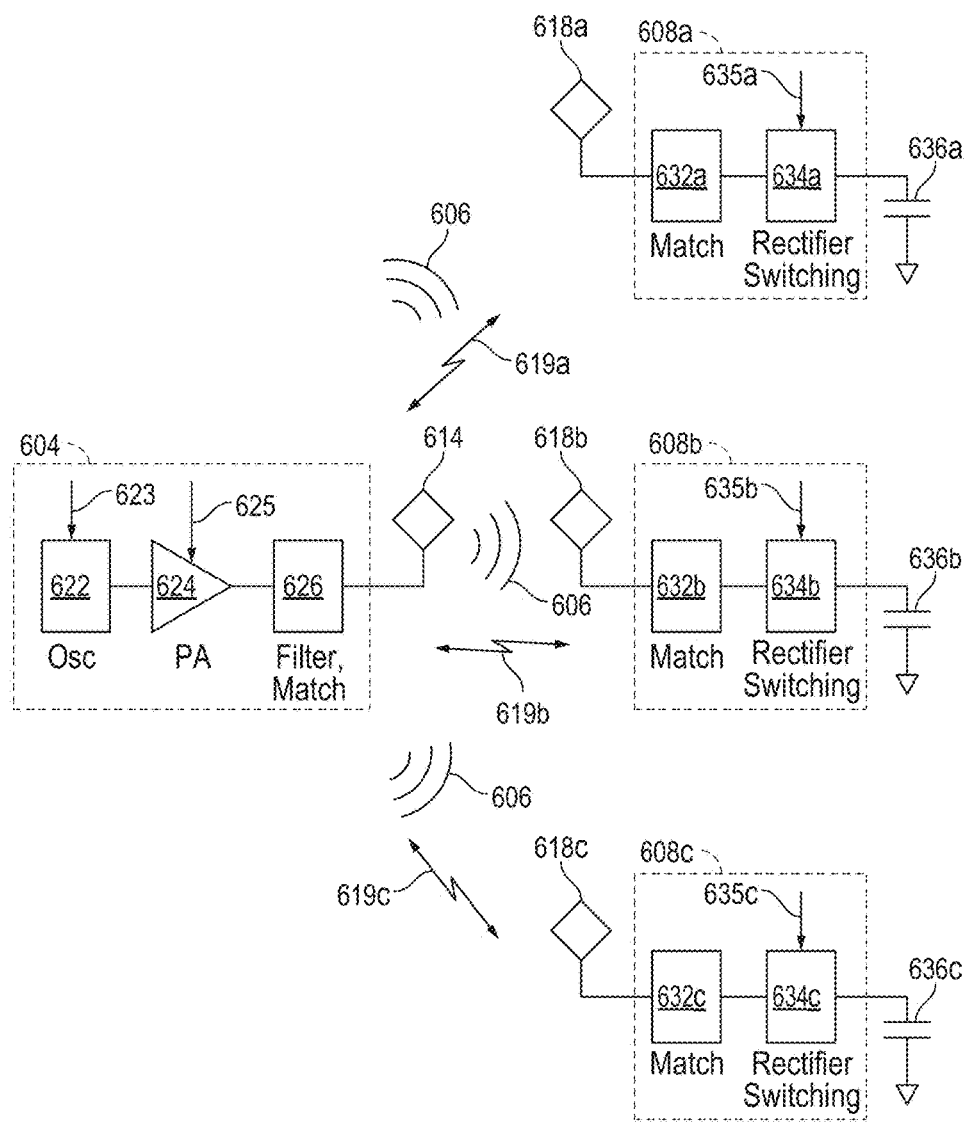
FIG. 6 is a functional block diagram of an exemplary wireless power transfer system as in FIG. 2, where a transmitter may wirelessly provide power to multiple receivers, in accordance with various exemplary embodiments of the invention.

FIG. 6 is a functional block diagram of an exemplary wireless power transfer system 600 as in FIG. 2, where a transmitter 604 may wirelessly provide power to multiple receivers 608a, 608b, and 608c, in accordance with various exemplary embodiments of the invention. As shown in FIG. 6, a transmitter 604 may transmit power via a transmit coil 614 via a field 606. Receiver devices 608a, 608b, and 608c may receive wireless power by coupling a portion of energy from the field 606 using receive coils 618a, 618b, and 618c to charge or power respective loads 636a, 636b, and 636c. Furthermore, the transmitter 604 may establish communication links 619a, 619b, and 616c with receivers 618a, 618b, and 618c respectively. While three receivers 608a, 608b, and 608c are shown, additional receivers (not shown) may receive power from the transmitter 604.

In a wireless power transfer system 600 the receivers 608a, 608b, or 608c may correspond to the load the transmitter drives while transferring power. As such, the load driven by the transmitter 604 may be a function of each receiver 608a, 608b, or 608c that is wirelessly receiving power from the field 606. When receivers 608a, 608b, or 608c enter the field 606, leave the field, or disable or enable their capability to receive power from the field 606, the complex load presented to the transmitter 604 is altered accordingly. Both resistive and reactive variations of the load are altered. The behavior of the transmitter 604 may be a function of characteristics of the variable complex load. For example, the efficiency at which the transmitter 604 may provide power to a receiver 608a, 608b, or 608c may vary as the complex load of the transmitter 604 varies. Furthermore, the amount of power that the transmitter 604 outputs may also vary as the complex load varies. Each of the receivers 608a, 608b, and 608c may form a portion of the load of the transmitter 404 when each receiver 608a, 608b, and 608c is receiving power via the field 606. The total impedance of the load seen by the transmit coil 614 may be a sum of impedances resulting from each receiver 608a, 608b, and 608c as the impedances they present to the transmit circuit 614 may combine in series.

In one aspect, exemplary embodiments are directed to a transmitter 604 that is suitable for efficiently charging a dynamic number of receivers 608a, 608b, and 608c. To efficiently allow for two receivers 608a and 608b to receive more power than when one receiver 608a is positioned to receive power, the transmitter 604 may be preferably designed such that the load (characterized by its complex impedance) at which the maximum power may be delivered is lower than the load at which the maximum transmitter efficiency may be provided. Furthermore, the transmitter 604 may be preferably designed to provide power at high efficiency over a resistive and reactive range of complex load values as a variable number of receivers 608a, 608b, and 608c will result in a range of different loads being presented to the transmitter 604. Otherwise, significant power losses may arise. Moreover, the transmitter 604 may be preferably designed such that the load at which maximum power is provided is greater than a total load presented by multiple receivers 608a, 608b, and 608c. In this case, the transmitter 604 may have sufficient power to supply multiple devices simultaneously.

Figure 7:
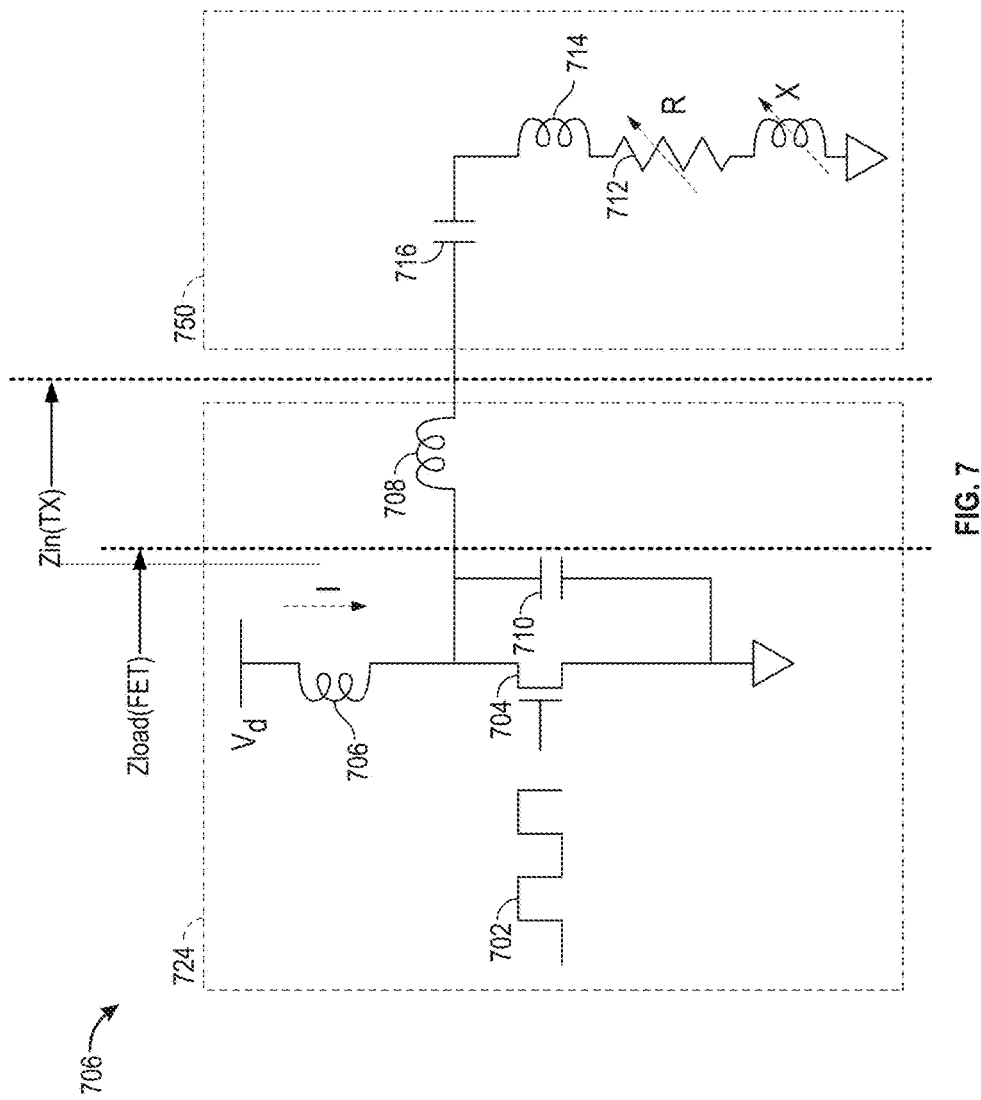
FIG. 7 is a schematic diagram of a driver circuit that may be used in the transmitter of FIG. 6, in accordance with exemplary embodiments of the invention.

The transmit circuit may be driven by a driver circuit. FIG. 7 is a schematic diagram of a driver circuit 724 that may be used in the transmitter 604 of FIG. 6, in accordance with exemplary embodiments of the invention. As stated, the power output and efficiency of the driver circuit (e.g., a driver circuit 424) varies as a function of the load presented to the driver circuit 724. In some embodiments, the driver circuit 724 may be a switching amplifier. The driver circuit 724 may be configured to receive a square wave and output a sine wave to be provided to the transmit circuit 750. The driver circuit 724 is shown as an ideal (i.e., no internal resistive losses) class E amplifier. The driver circuit 724 includes a switched shunt capacitor 710 and a series inductance 708. $V_D$ is a DC source voltage applied to the driver circuit 724 that controls the maximum power that may be delivered into a series tuned load. The driver circuit 724 is driven by an oscillating input signal 702 to a switch 704.

While the driver circuit 724 is shown as a class E amplifier, embodiments in accordance with the invention may use other types of driving circuits as may be known by those skilled in the art. A driver circuit 724 may be used to efficiently drive a load. The load may be a transmit circuit 750 configured to wirelessly transmit power. The transmit circuit 750 may include a series inductor 714 and capacitor 716 to form a resonant circuit as described above with reference to FIG. 3. While the load is shown as a transmit circuit 750, embodiments in accordance with the invention may be applicable to other loads. As described above with reference to FIG. 6, the load presented to the transmit circuit 750 may be variable due to the number of wireless power receivers 608a, 608b, and 608c and may be represented by a variable resistor 712 indicative of resistive variation of the load and a variable inductor 712 indicative of reactive variation of the load. The driver circuit 724 may be driven by an input signal 702, such as from an oscillator 222 (FIG. 2). As the load presented to the transmit circuit 750 varies, for example, due to a dynamic number of wireless power receivers 638a, 638b, and 638c as described above, a load presented to the driver circuit 724 may also vary according to a wide resistance and reactance range. For example, when an additional receiver 638a is positioned to receive power from the transmit circuit 750, the receiver 638a picking up power increases the resistance presented to the transmit circuit 750 and therefore to the driver circuit 724. In addition, adding a receiver 638b that includes certain material (e.g., metal) may result in a large reactance swing presented to the transmit circuit 750 and therefore to the driver circuit 724. For example certain large receivers (e.g., a tablet) may present a negative reactance swing on the order of an excess of −j100. Power provided by the driver circuit 724 may not be flat across a load reactance range.

The load presented to the driver circuit 724 may be described by the impedance presented to the transmit circuit 750 including both resistive and reactive components and defined as $Zin(TX)=Rin(TX)+jXin(TX)$. The value of Zin (TX) depends on various factors such as the transmit coil and receive coil structures, the type and number of devices to be charged, the power demanded by each receiver, and the like. The range of the load may be defined by four corner impedances:

$$R_{IN\_TX\_MIN} \leq \text{Re}\{Z_{IN\_TX}\} \leq R_{IN\_TX\_MAX}$$

$$X_{IN\_TX\_MIN} \leq \text{Im}\{Z_{IN\_TX}\} \leq X_{IN\_TX\_MAX}$$

Figure 8A:
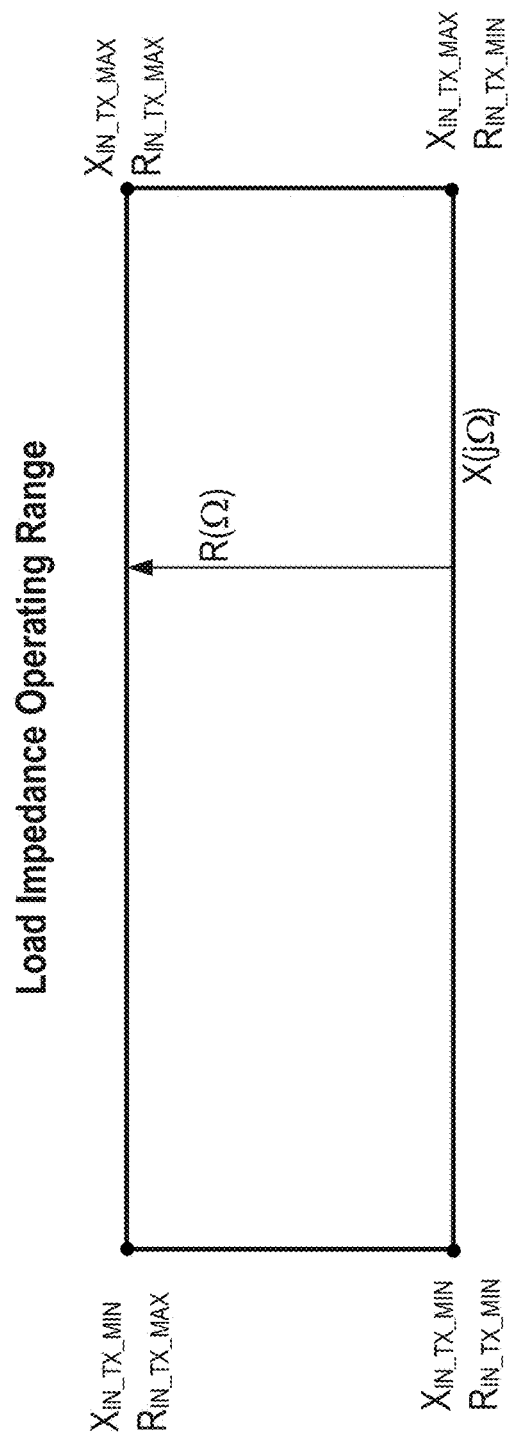
FIG. 8A is a diagram showing an exemplary range of complex impedances that may be presented to the driver circuit during operation of a wireless power transmitter.

FIG. 8A is a diagram showing an exemplary range of impedances that may be presented to the transmit circuit 750 during operation. FIG. 8A shows the corner impedances as described above. According to the type and number of devices to charge, the possible values for the corner impedances may vary widely. For example, for purposes of illustration, $R_{IN\_TX\_MIN}$ may be defined as 0Ω while $R_{IN\_TX\_MAX}$ may be 75Ω. In addition, for purposes of illustration, $X_{IN\_TX\_MIN}$ may be defined as −50 jΩ while $X_{IN\_TX\_MAX}$ may be +50 jΩ. In accordance with another embodiment, $R_{IN\_TX\_MIN}$ 0Ω, $R_{IN\_TX\_MAX}$ is substantially 200Ω, $X_{IN\_TX\_MIN}$ is substantially −200 jΩ, and $X_{IN\_TX\_MAX}$ is substantially +200 jΩ. The principles described herein may apply to these and other complex impedance ranges. According to another exemplary embodiment, in an operating mode the real load impedance (i.e., resistance) presented to the driver circuit 724 may fall between 1Ω and 40Ω. Additionally, in an operating mode, the imaginary load impedance (i.e., reactance) may be between 5 jΩ and 48.7 j (for example in the absence of multiple receivers). In another embodiment, impedances presented to the driver circuit 724 in an operating range may be from 4Ω to 40Ω and between −4 jΩ and 50 jΩ Due to, for example, a varying number of wireless power receivers or other factors, the driver circuit 724 may be presented loads with resistances in the 0 to 80Ω range and reactances from the −165 jΩ to 95 jΩ. It is desirable for the driver circuit 724 to operate efficiently and provide sufficient power to any load falling within this range. It is desirable to provide efficient and substantially constant power over all these ranges given various design considerations.

In one aspect, a range of impedance values presented to the driver circuit 724 may be defined by complex impedance values including real impedance values and imaginary impedance values. The real impedance values may be defined or characterized by a ratio between a first real impedance values to a second real impedance value. The ratio could be one of 2 to 1, 5 to 1, and 10 to 1. For example, the range of real impedance values presented to the driver circuit 724 could be between 8Ω and 80Ω (a ratio of 10:1). In another embodiment, the range could be between 4Ω and 40Ω (also a ratio of 10:1). In another embodiment, the range could be between substantially 1Ω and substantially 200Ω. In addition, the range of impedance values presented to the driver circuit 724 may be further defined by a range of imaginary impedance values. The range of the imaginary impedance values may be defined as a ratio of the magnitude of the imaginary impedance values (i.e., magnitude between minimum and maximum imaginary impedance values) to a magnitude of the real impedance values. For example, a magnitude of the real impedance values could be the magnitude of the difference between a first real impedance value and a second real impedance value. The ratio of the magnitude of the imaginary impedance values to the magnitude of the real impedance values may be at least one of 1:2, 2:1, 1:1, 2:3 etc. For example, if a real impedance range is between 8Ω and 80Ω, a magnitude may be 72Ω. As such, if the ratio of the magnitude of the imaginary impedance values to the magnitude of the real impedance values is 2 to 1, then the range of imaginary impedance values may be 144 (i.e., a range from −4 jΩ to +140 jΩ). In any event, it is desirable to provide efficient and safe operation over a range of complex impedance values that may be defined according to various methods.

Figure 8B:
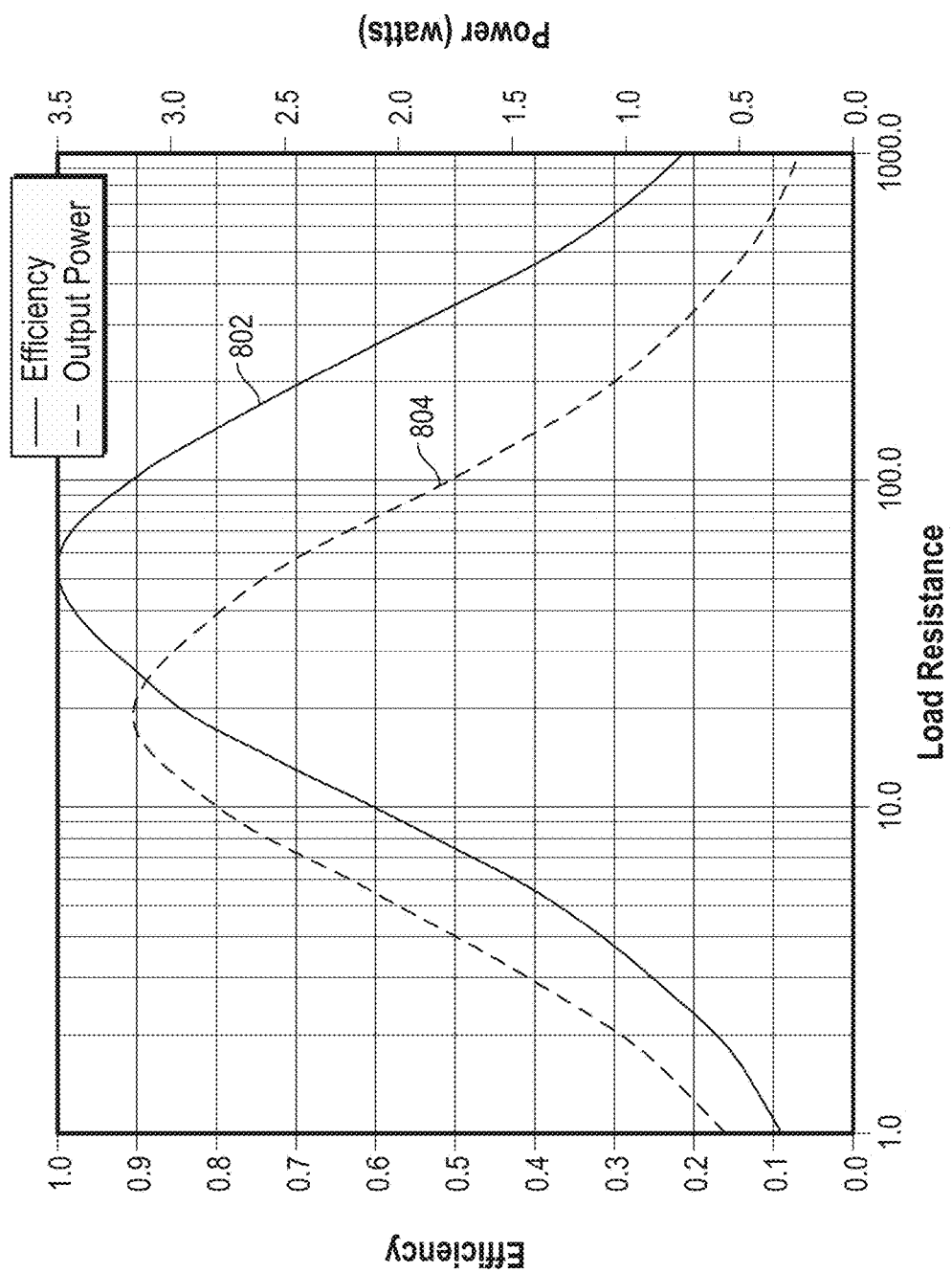
FIG. 8B is a plot showing efficiency and output power of the driver circuit of FIG. 7 as a function of the real impedance of a load of a driver circuit.

As described above, the power and efficiency of a driver circuit 724 are a function of the load the driver circuit 724 is driving. FIG. 8B is a plot showing efficiency 802 and output power 804 of the driver circuit 724 of FIG. 7 as a function of the real impedance of a load (i.e., load resistance) of the driver circuit 724. As shown in FIG. 8, 100% (or maximum) efficiency at a single real load impedance value may exist (e.g., 50Ω as shown in FIG. 8) for an ideal class E amplifier. The efficiency 802 decreases as the load impedance varies in either direction. FIG. 8 also shows that the total output power 804 is similarly a function of the load impedance and which peaks at particular load impedance value (e.g., 20Ω). Similar results are described in Raab, "Effects of Circuit Variations on the class E Tuned Power Amplifier" (IEEE Journal of Solid State Circuits, Vol. SC-13, No. 2, 1978).

If the driver circuit 724 drives a load with a constant impedance, then the driver circuit 724 may be ideally designed (e.g., values of the capacitor 710 and inductor 708, etc. may be chosen) such that the driver circuit 724 operates at maximum efficiency. For example, by using the values in the plot in FIG. 8B, if the driver circuit 724 is configured to drive a load with an unvarying impedance that is substantially equal to 50Ω, the driver circuit 724 may drive the load at a maximum efficiency level. However, if the load of the driver circuit 724 varies, then the average efficiency and power delivered by the driver circuit 724 may be significantly lower than its maximum efficiency or maximum power as shown in FIG. 8. Furthermore, as the impedance of the load increases, the power delivered may not increase.

As shown in FIG. 7 and as described above, the load driven by the driver circuit 724 may be a wireless power transmit circuit 750. The load presented to the transmit circuit 750, given a varying number of wireless power receivers 608a, 608b, 608c (FIG. 6), may thus vary the load seen by the driver circuit 724. In this case, the total load impedance presented to the transmit circuit 750 may be the sum of each of the load impedances presented by each wireless power receiver 608a, 608b, 608c as they may combine in series. Ideally, the driver circuit 724 would provide maximum efficiency over all loads while having the power increase linearly as the resistance of the load increases. Power would then be divided among the loads. However, as seen in FIG. 8B, maximum efficiency for the driver circuit 724 may occur for a single real load impedance value.

Figure 9:
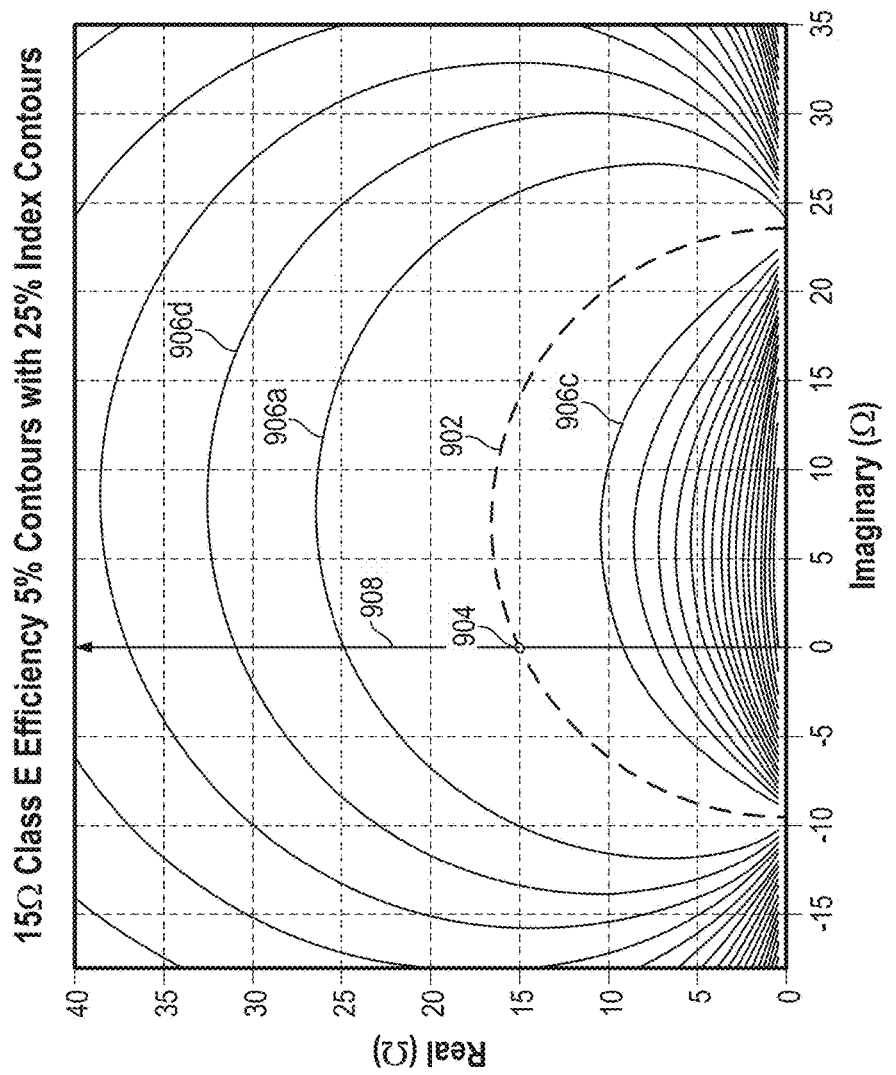
FIG. 9 is a contour plot showing the efficiency of a driver circuit as in FIG. 7 as a function of the real and imaginary components of the load impedance presented to the driver circuit.

One aspect of exemplary embodiments are directed to achieving high efficiency of the driver circuit 724 as the real load impedance varies while also increasing power as the load resistance increases. In one aspect, this may allow for efficient wireless power transfer for a variable number of wireless power receivers 608a, 608b, and 608c. To provide improved efficiency of a variety of loads, the efficiency of a class E amplifier 724 is analyzed over variations in both a real component of the load impedance (i.e., resistance) and the imaginary component of the load (i.e., reactance). FIG. 9 is a contour plot showing the efficiency of a driver circuit 724 as in FIG. 7 as a function of the real and imaginary components of the load impedance presented to the driver circuit 724. The plot may correspond to a driver circuit 724 that is designed to have a maximum efficiency for a load with a resistance of 15Ω and a reactance of 0Ω. In the illustrated embodiment, the drive voltage is 15 V. The complex load plot of FIG. 9 shows efficiency contours 906a, 906*b*, and 906*c* at increments of 5%. For example, points along the contour 906*a* may represent the combinations of resistance and reactance values that correspond to a load for which the class E amplifier is 95%. The contour 902 corresponds to load impedance values that correspond to an efficiency 100%.

The results of the plot shown in FIG. 8B may be seen in FIG. 9 by holding the reactance at zero and varying the resistance from 0 to 40Ω as shown by the arrow 908. The path 908 passes through the point 904 with a value of 15Ω+j0Ω where efficiency is 100%. The contour 902 shows that there is a path (e.g., a range of impedances) at which efficiency is 100%. As such, rather than just analyzing efficiency over real impedance values only, analyzing efficiency for both real and imaginary impedance values (i.e., a range of resistance and reactance values) shows that there is a range of complex impedance values for which efficiency of the driver circuit 724 is 100%.

Figure 10A:
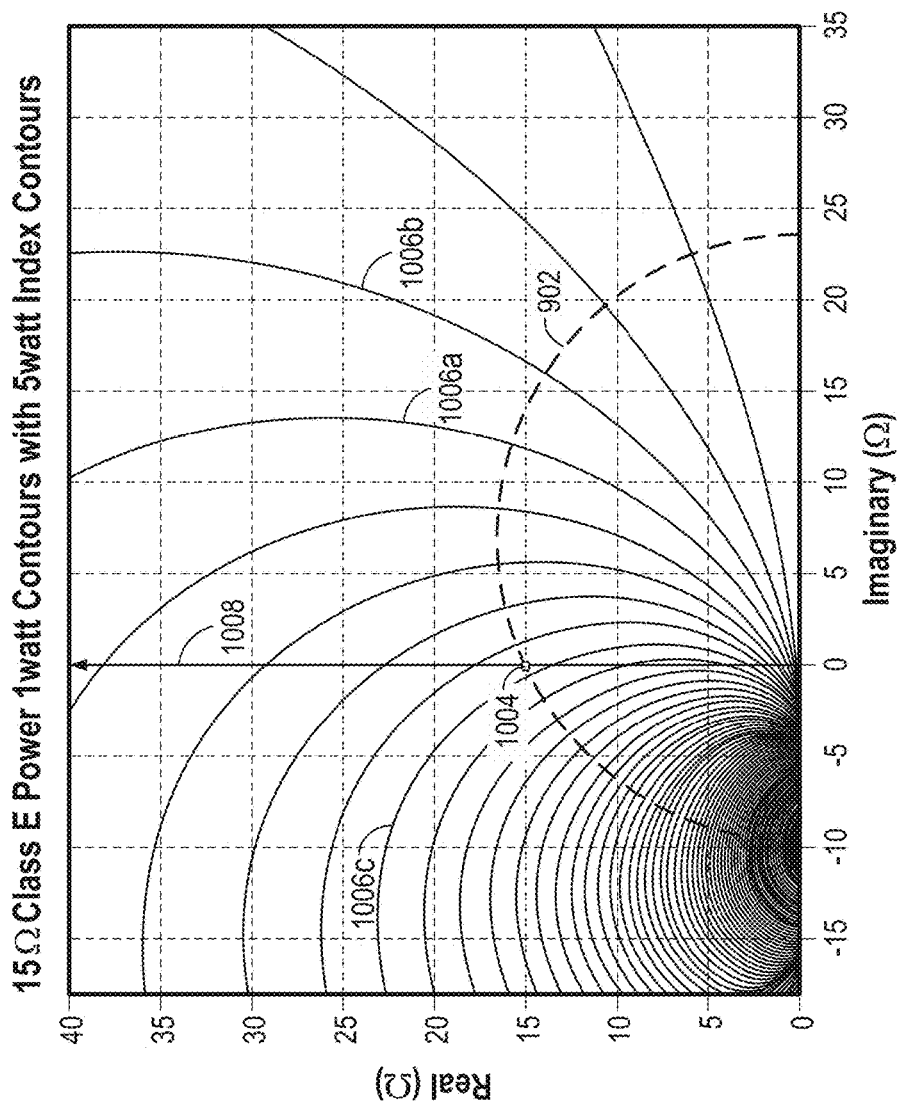
FIG. 10A is a contour plot showing the power output of a driver circuit as in FIG. 7 and a maximum efficiency contour as a function of real and imaginary components of the load impedance presented to the driver circuit.

FIG. 10A is a contour plot showing the power output of a driver circuit 724 as in FIG. 7 as a function of real and imaginary components of the load impedance presented to the driver circuit 724. The complex load plot of FIG. 10A shows power contours 1006*a*, 1006*b*, and 1006*c* at 1 watt increments. For example, points along the contour 1006*b* may represent combinations of resistance values and reactance values that represent an impedance value at which 5 watts of power may be delivered. Points along the contour 1006*c* may represent combinations of resistance values and reactance values that represent an impedance value at which 10 watts of power may be delivered. The results of the plot shown in FIG. 8B may be seen by holding the reactance at zero and varying the resistance from 0Ω to 40Ω as shown by the arrow 1008. The path 1008 passes through the point 1004 where efficiency (shown by the contour 902 from FIG. 9) is 100% and power delivered is a little over 6 Watts. The 100% efficiency contour 902 of FIG. 9 placed in the plot of FIG. 10 shows that there is path 902 where efficiency is 100% and where the power continually increases as shown as the contours represent increasing power. As shown in FIGS. 9 and 10, the 100% efficiency path 902 starts at an impedance of j24Ω, passes through 15+j0Ω and continues to −j10Ω.

FIG. 10B is another plot showing power output and efficiency of a driver circuit 724 as in FIG. 7 as a function of real and imaginary components of the load impedance presented to the driver circuit 724. The contour 902 represents the combinations of resistance and reactance values for which efficiency is maximum, where efficiency may be defined as the ratio of power delivered to the load divided by the DC power into the FET drain of the driver circuit 724. The contour 1006 represents the resistance and reactance values for which power delivered to the load is constant for a particular drive voltage $V_d$. While power may depend on both the drive voltage $V_d$ and the complex load, efficiency may depend on the load alone. The drive voltage $V_d$ and power output may be chosen such that the power contour 1006 passes through the efficiency contour 902 at the peak value of the load to the FET of the driver circuit 724. Accordingly, the contours 1006 and 902 are exemplary and indicate that there is a range of complex values for which the driver circuit 724 is efficient and for which power is constant. It is noted that the contours shown in FIG. 10B may reflect the load seen by the FET of the driver circuit 724, Zload(FET) which may be offset from results that would be in terms of Zin(TX). The difference may be due to a series inductance. However, Zload(FET) and Zload may be used interchangeably. FIG. 10B shows one particular results for when a drive voltage is on the order of 10 volts and resulting power is on the order of 2.45 Watts. In this case values were selected to result in the power contour 1006 passing through the efficiency circle at the peak value of Rload(FET) as shown. As a result when the Zload is 16.55+24.3 j ohms, at 10V dc, a single sided driver circuit 724 delivers 2.45 watts with maximum efficiency into the real part of the load. These values are merely exemplary and for purposes of illustration of values that may be found to define the maximum efficiency and constant power contours.

As indicated above, however, a wide range of reactive and resistive impedances may be presented to the driver circuit 724 from a transmit circuit 750 due to, for example, a variable number of receivers being positioned to receive power from the transmit circuit 750. Impedance values presented to the driver circuit 724 as a result of the variation of impedance presented to the transmit circuit 750 may result in reduced efficiency and fluctuations in the amount of power delivered.

FIGS. 11A, 11B, 12A, and 12B show corresponding measured results as compared to FIG. 10 showing power output and efficiency of a driver circuit 724 as in FIG. 7 as a function of real and imaginary components of the load impedance presented to the driver circuit 724. The measured results show power and efficiency contours as described above and when taking into account various losses or other effects of the system. For example, the results may illustrate the effects of losses of the FET of the driver circuit (e.g., as compared to an ideal switch) and the effect of the resonant series LC circuit of the transmit circuit 750 between the switch and the load. As such FIGS. 11A, 11B, 12A and 12B show measured efficiency and power contours when all load values within the range defined by $R_{IN\_TX\_MIN}=0\Omega$, $R_{IN\_TX\_MAX}=75\Omega$, $X_{IN\_TX\_MIN}=-50$ j$\Omega$, and $X_{IN\_TX\_MAX}=+50$ j$\Omega$ are presented to a driver circuit 724. The results may reflect the output from a double-sided driver circuit 724 (i.e., including two driver circuits 724 of FIG. 7) operating a particular driver voltage (e.g., both driven by a 5.5 V DC supply). In using the double-sided driver circuit 724, load to each FET of the driver circuit 724 is ½ that seen in FIGS. 11A, 11B, 12A, and 12B.

Figure 11A:
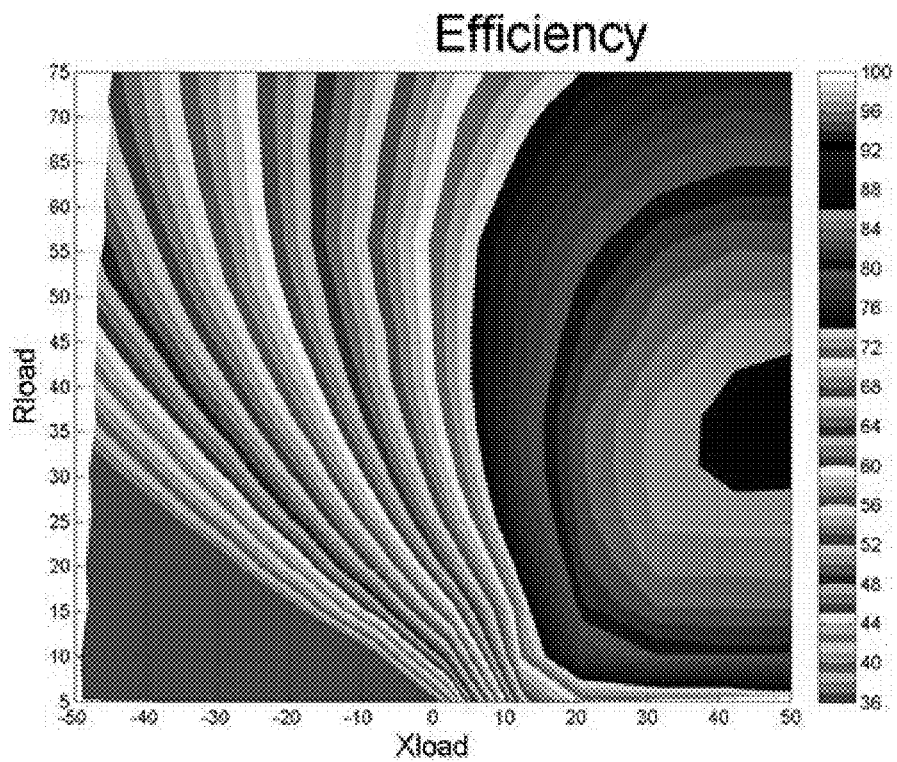
FIGS. 11A, 11B, 12A, and 12B show corresponding measured results as compared to FIG. 10B showing power output and efficiency of a driver circuit as in FIG. 7 as a function of real and imaginary components of the load impedance presented to the driver circuit.
Figure 11B:
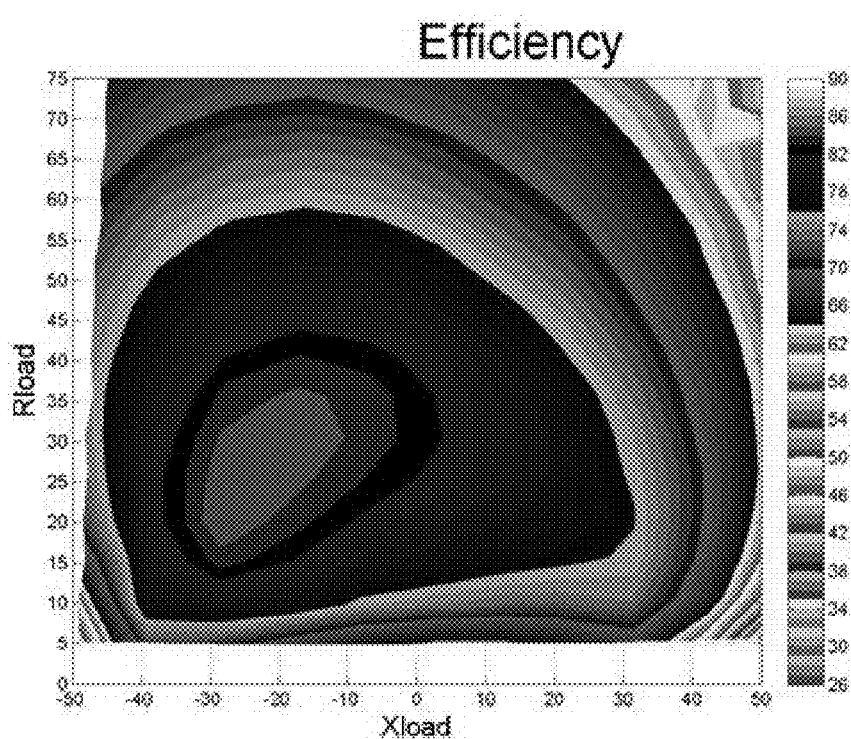
Figure 12A:
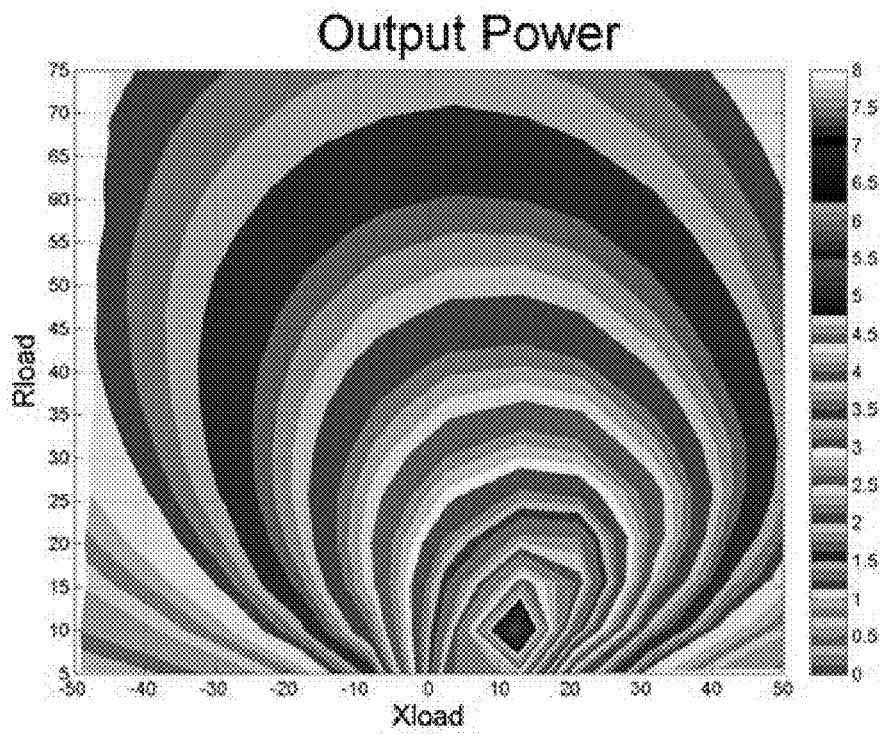
Figure 12B:
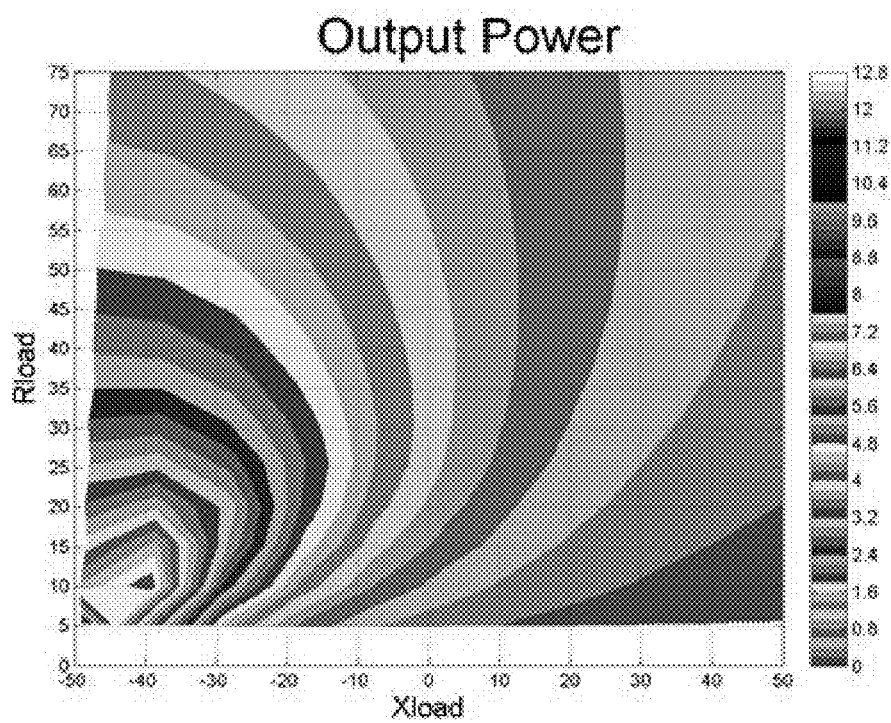

In accordance, FIG. 11A shows measured efficiency contours for a tuned double-sided driver circuit 724 without an added series inductance 708 for the load range as noted above. FIG. 11B shows measured efficiency contours for a tuned double-sided driver circuit 724 with an added series inductance 708. In accordance FIG. 12A shows measured power contours for a tuned double-sided driver circuit 724 without an added series inductance 708 for a wide load range as described above. FIG. 11B shows measured power contours for a tuned double-sided driver circuit 724 with an added series inductance 708. Thus, FIGS. 11A-B shown different powers for the same load, illustrating the effect of $V_D$ on power. FIGS. 12A-B show output power.

It is noted that the measured efficiency and power contours of FIGS. 11A, 11B, 12A, and 12B are merely exemplary for a particular configuration of driver circuit 724 and are used for purposes of illustration. More specifically, FIGS. 11A, 11B, 12A, and 12B provide values illustrating the range of complex impedance values for which the driver circuit 724 is efficient and for which power is constant. It is noted that the contour plots of FIGS. 11A, 11B, 12A, and 12B may correspond to results from a double-sided driver circuit 724 configuration. To compare with a single sided driver circuit 724, the values would be divided by two. As compared to FIG. 10B, it is noted that the constant power contours shown in FIGS. 12A and 12B are still circular in form, although distorted due to the effect of body diodes inherent in FET 704. Likewise, the efficiency contours shown in FIG. 11A are similar to FIG. 10B, however efficiency values decrease as the load resistance to the FET decreases which may be due to losses in the FET 704.

Based on the results of FIGS. 9-12, certain aspects of exemplary embodiments are directed to an impedance transform circuit (also referred to herein as a filter circuit) located between the driver circuit 724 and the transmit circuit 750 that transforms a variable load impedance presented to the transmit circuit 750 into values for which the driver circuit 724 is highly efficient and where power is substantially constant. These values may be defined by the high efficiency and constant power contours as shown in FIGS. 9-12. The variable load presented to the transmit circuit 750 may vary widely over both reactance and resistance as further described above. As will be indicated below, the transform circuit is configured to transform the impedance to maintain the efficiency at a high level while keeping the power transfer as constant as possible over a wide range in reactive load. This may allow for a driver circuit 724 in a wireless power transmitter 604 to efficiently provide power as the load presented to the transmit circuit 750 varies reactively and resistively due to a dynamic number of wireless power receivers 608a, 608b, and 608c (FIG. 6).

Figure 13:
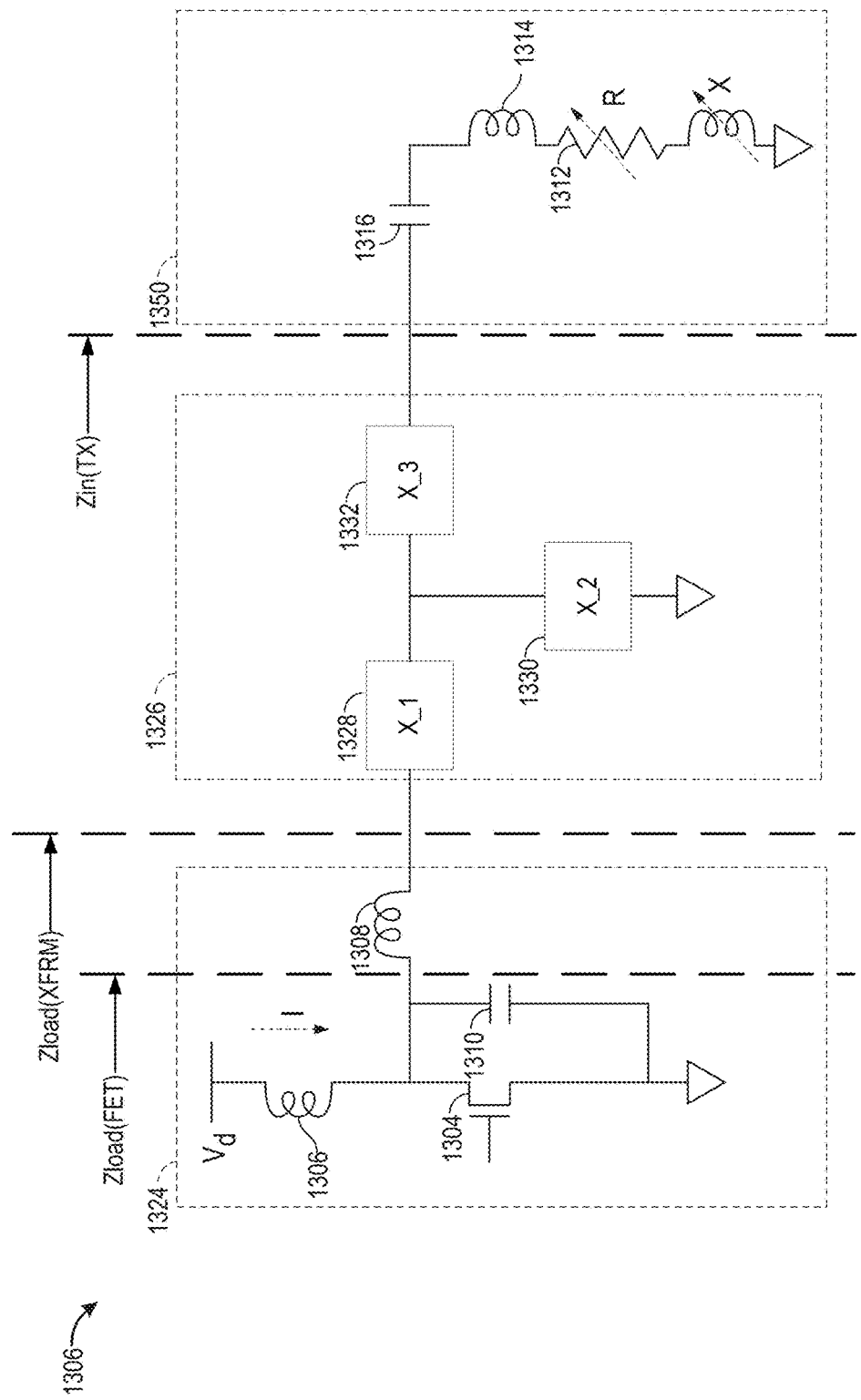
FIG. 13 is a schematic diagram of a driver circuit as in FIG. 7 including a filter circuit, in accordance with exemplary embodiments of the invention.

In one embodiment, a filter circuit is used to transform a variable load impedance presented to a transmit circuit 750 into complex load values for which the driver circuit 724 may be highly efficient and for which power is constant. FIG. 13 is a schematic diagram of a driver circuit 1324 as in FIG. 7 including a filter circuit 1326, in accordance with exemplary embodiments of the invention. The filter circuit 1326 (i.e., a transform circuit) is positioned between the driver circuit 1324 and the transmit circuit 1350. As shown the transmit circuit 1350 shows a variable load 1312 including both variations in resistance and variations in reactance. The filer circuit 1326 includes three reactive components, X1 1328, X2 1330, and X3 1332. In some embodiments, X1 1328 and X3 1332 are series inductors, while X2 1330 is a shunt capacitor. The filter circuit 1326 is configured to transform the impedance Zin(TX) presented by the transmit circuit 1350 into an impedance Zload(XFRM) presented to the driver circuit 1324 including the series inductor 1308. This impedance, Zload(XFRM) is then shifted by the series inductance 1308 so as to "best" fit the load lines for which the driver circuit 1324 is maximally efficient with a constant or steady power as the load varies. The full transformed impedance presented to the FET 1304 is defined by Zload (FET). The component values for the filter circuit 1326 and series inductance 1308 are configured to increase power linearly with the resistive portion of the load presented the transmit circuit 1350 and have as high efficiency as possible as the reactance varies. The values of the components are selected to provide a balance between maximizing efficiency versus variation in the resistive portion Rin(TX) and minimizing load power variation versus variation in the reactive portion Xin(TX).

While also operating as a low pass filter configured to reduce harmonics in the signal, the filter circuit 1326 is configured to convert linear variations in Zin(TX) to circular variations in Zin(XFRM). As noted above, the series reactance 1308 shifts the load into a particular range for the FET 1304. The filter circuit 1326 is configured as a T network. While other configurations are also contemplated according to the embodiments described herein, the T network may reduce the number of components.

Figure 14:
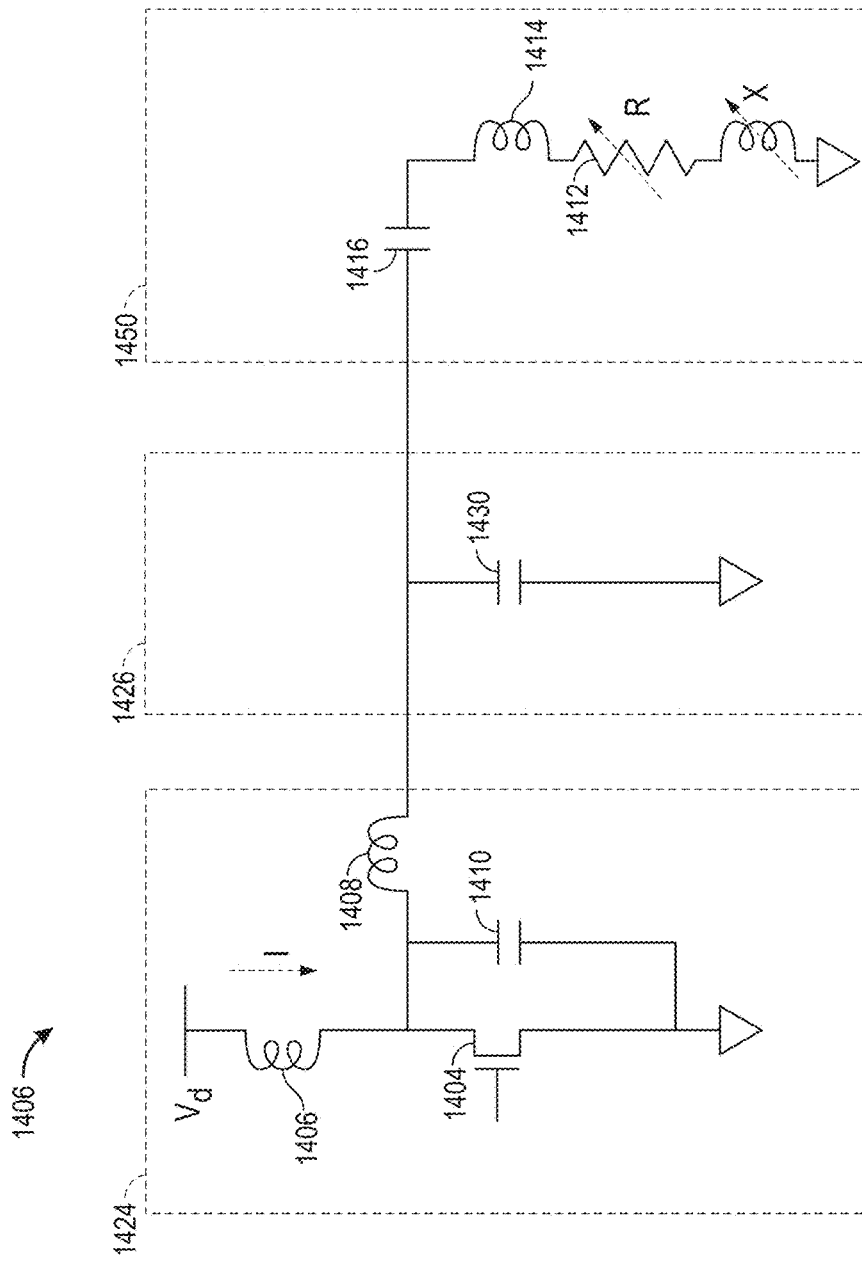
FIG. 14 is a schematic diagram of the circuit of FIG. 13 in accordance with an embodiment.

It is noted that according to some embodiments, where series inductors are used for reactance components X1 1328 and X3 1332, high power requirements may increase the cost of the inductors. As such, it may be desirable to eliminate one or more of the reactance components. Using the T network may allow for eliminating the reactance components X1 1328 and X3 1332 which may be absorbed into the coil 1314 and/or the series inductor 1308. FIG. 14 is a schematic diagram of the circuit of FIG. 13 in accordance with an embodiment. As shown, reactance component X2 1330 of FIG. 13 is shown as a shunt capacitor 1430. Reactance components X1 and X3 of FIG. 14 are absorbed into the coil 1414 and series inductor 1408. As such, the filter circuit 1426 includes only of a shunt capacitor. It is noted that the values of X1 and X3 are still selected based on the principles described herein to achieve the desired impedance transformation, and as such, the amount of the determined values of X1 and X3 is taken into account when being absorbed into the other series elements. It is noted that the shunt capacitor 1430 could be replaced by a single shunt capacitor network (e.g., some configuration of parallel or series connected capacitors). However, only a shunt network is needed. This may reduce the number of components and reduce other high cost inductors. The values of the reactive components 1410, 1408, 1430, 1416, and 1414 are selected such that the circuit 1406 is configured to transform the impedance into values that correspond to high efficiency for the driver circuit 1424 with constant power. For example, the shunt capacitor 1430 is selected based on an impedance transformation ratio which is proportional to output power or current at a fixed supply voltage. The series L value 1408 may then be selected from the shunt C value. As such the circuit 1406 may work efficiently across a wide reactance range while maintaining its output power, and reactance load switches to tune out the reactance swing may be unnecessary. As such, a single shunt capacitor network positioned between a class E amplifier and a resonant transmit circuit, when combined with tuning adjustments of the existing inductances, can provide a particular impedance transform as described herein. This includes delivering power linearly versus the real load over a wide reactance range, having reduced sensitivity to the reactive load changes and providing high efficiency for substantially maximum power. Furthermore, the value of the shunt capacitor 1430 may be selected to determine an impedance ratio of the filter transform that may allow trading the impedance ratio off against other factors such as mutual coupling between a source coil (i.e., transmitter) and the load coil (i.e., receiver).

With reference again to FIG. 13, values of the components of the filter circuit 1326 may be chosen such that the varying impedance of the transmit circuit 1350 (due to receivers 608a, 608b, and 608c) is transformed by the filter circuit 1326. The transformed impedance values may correspond to impedance values (such as those as shown in FIGS. 9 and 10) that provide highly efficient driver circuit 1324 operation while also increasing the flatness of power delivery given wide reactance swings. The component values of the filter circuit 1326 are chosen to perform an impedance transform that transforms the impedance of the load 1312 seen by the transmit coil 1350 into a complex impedance that fits as closely as possible to complex values that provide high efficiency and constant power as shown in FIGS. 9-12. In some embodiments as will be further described below, the selection of the series inductance 1308 of the driver circuit 1324 is used in conjunction with the filter circuit 1326 to shift the impedance transformation performed by the filter circuit 1326 to match as closely as possible to complex values that provide high efficiency and constant power.

In one exemplary embodiment, the filter circuit 1326 may be configured to modify the impedance presented to the filter circuit 1326 (e.g., the impedance of the transmit circuit 1350 due to a variable number of receivers 608a, 608b, and 608c) to maintain the efficiency of a driver circuit 1324 at a level that is within 20% of a maximum efficiency of the driver circuit 1324 within some complex impedance range with real and reactive variations. In another embodiment, efficiency may be maintained at a level that is within 10% or lower of a maximum efficiency of the driver circuit 1324. The filter circuit 1326 is further configured to maintain a substantially constant power output level irrespective of the reactive variations within the complex impedance range presented from the transmit circuit 1350. Moreover, the filter circuit 1326 is configured to maintain a substantially linear relationship between the power output level and the resistive variations within the complex impedance range. The filter circuit 1326 may be referred to as or be configured as an impedance transformation network. The range of impedance values presented to the filter circuit 1326 that are transformed by the filter circuit 1326 may be characterized by a range of complex impedance values. The range of complex impedance values may be within a range defined by a first real impedance value and a second real impedance value, where a ratio between the first real impedance value to the second real impedance value is at least two to one. In addition, the range of reactive variation of the impedance may be related to the real impedance range. For example, the magnitude of the range of reactive variation for which the filter is configured to maintain efficiency at 20% of a maximum efficiency may be substantially twice the magnitude of the real impedance range. The center of the reactive impedance range may be substantially centered at the instantaneous real impedance value (i.e., resistive) presented to the transmit circuit. The filter circuit 1326 is further configured to maintain a substantially constant power level irrespective of the reactive variations within the impedance range. In addition, the filter circuit 1326 is configured to maintain a substantially linear relationship between the power level and the real variations within the impedance range. For example, the range of real (i.e., resistive) impedance values may be substantially between 8Ω and 80Ω or 4Ω and 40Ω having a ratio of 10 to 1. In this case, the range of imaginary (i.e., reactive) may have a magnitude on the order of 144 and could span anywhere from −74 jΩ to +152 jΩ depending on an instantaneous value of the real impedance. In another embodiment, the range of real impedance values may be between substantially 1Ω and substantially 200Ω. Furthermore, in an embodiment, the range of imaginary impedances may be between substantially −200 jΩ and +200 j jΩ. Within this range of real and imaginary impedances (i.e., resistive and reactive), the filter circuit 1326 and selection of series inductance 1308 is configured to maintain the efficiency of the driver circuit 1324 within 20% of a maximum efficiency of the driver circuit 1324, maintain a substantially constant power level irrespective of the reactive variations, and/or maintain a substantially linear relationship between the power level and the real variations within the impedance range.

The imaginary impedance range may also be defined by a first imaginary impedance value and a second imaginary impedance value. The first imaginary impedance value and the second imaginary impedance value may define approximate minimum and maximum imaginary impedance values. The range of imaginary impedance values (i.e., the magnitude of the difference between the first imaginary impedance value and the second imaginary impedance value) may be defined by a ratio of the magnitude of the imaginary impedance value to the magnitude of the real impedance value (e.g., equal to a magnitude of the difference between the first real impedance value and the second real impedance value). The ratio may be at least one of 1:2, 2:1, 1:1, 2:3, 3:2, etc. For example, if the magnitude of the real impedance values is 72Ω, and the ratio is 2:1, the magnitude of the range of imaginary impedance values may be 144 jΩ (e.g., a range of a minimum to a maximum). In another example, in one embodiment, the first real impedance value may be substantially 4Ω, the second real impedance value may be substantially 40Ω, the first imaginary impedance value may be substantially −4 jΩ, and the second imaginary impedance value may be substantially j50Ω. A wide range of complex impedance values may be presented to the filter circuit 1126 given the design parameters and the potential number of receivers. As such, ranges and ratios contemplated by various exemplary embodiments described herein may substantially vary from the specific examples provided herein.

According to certain embodiments, a passive or fixed filter circuit 1326 (i.e., substantially all of the components of the filter circuit 1326 may be passive circuit elements) as shown in FIG. 13 may be provided. The circuitry would have an absence of dynamic switching in of reactive elements. As such, the filter circuit 1125 may not require control signals or other dynamic logic to control or configure the circuit as the load changes during operation. This may reduce cost and complexity and may provide other benefits as will be appreciated by one/those skilled in the art.

In some embodiments, a driver circuit 1324 may generate harmonics of 6.78 MHz, when the operating frequency of the driver circuits 1324 is substantially 6.78 MHz. For various reasons, including for meeting regulatory requirements, the filter circuit 1326 may be further configured to reduce unwanted harmonics produced by the driver circuit 1324. By using information derived from the plots such as FIGS. 9 and 10, the filter circuit 1326 may be designed (in various embodiments) to meet spectral emission mask requirements (via reducing harmonics), ensure that the load impedance at which maximum power may be delivered is above the load at which maximum efficiency is achieved, and/or expand the range of load impedance values for which the driver circuit 1324 is highly efficient.

Exemplary Filter Circuit Operation

Figure 15:
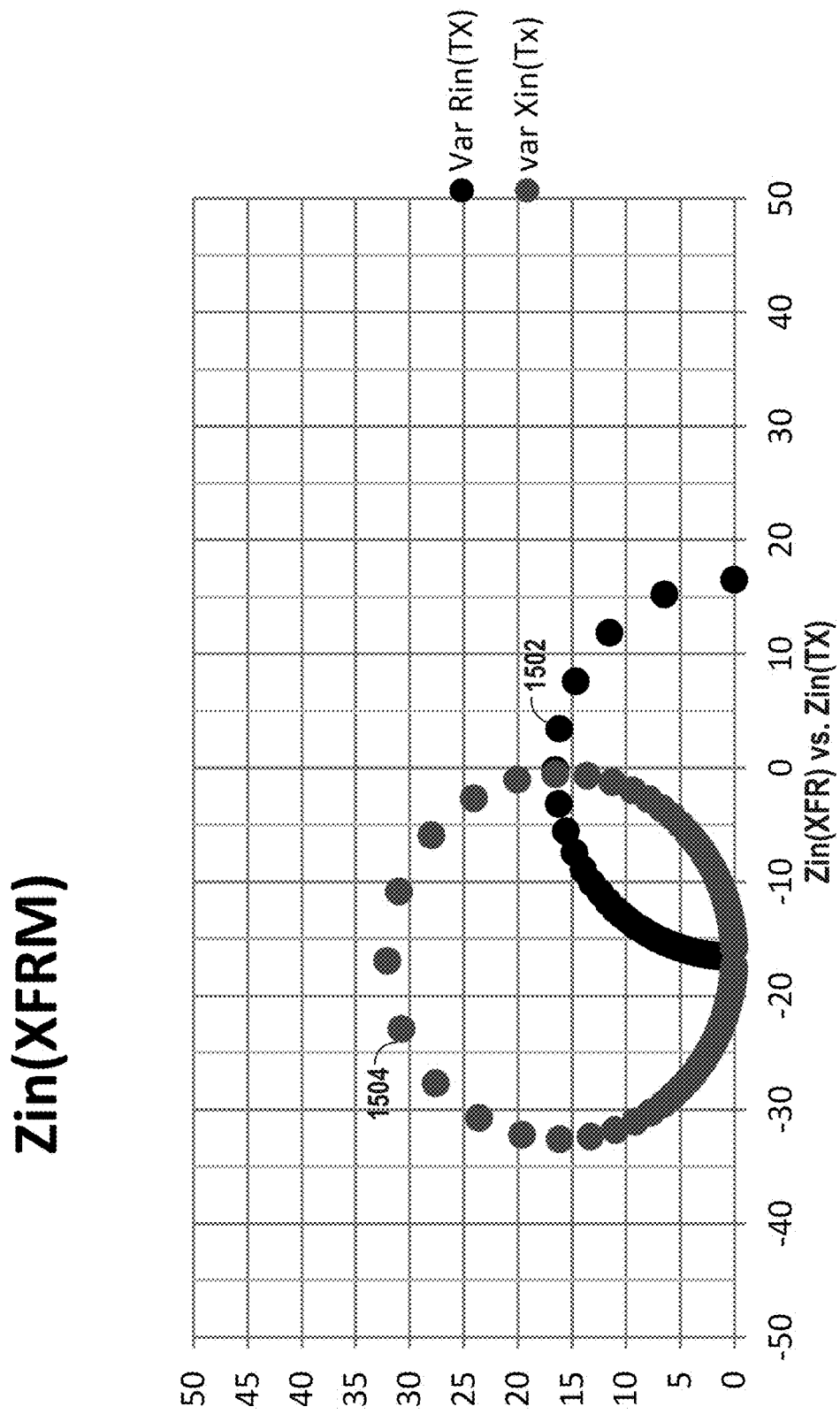
FIG. 15 is a plot showing the impedance transformed by the filter circuit versus the impedance presented to the transmit circuit as mapped to a high efficiency contour.

FIG. 15 is a plot showing the impedance transformed by the filter circuit 1326 versus the impedance presented to the transmit circuit 1350 as mapped to a high efficiency contour. For example, to illustrate the operation of the filter circuit 1326, FIG. 15 shows an exemplary result of a filter circuit 1326 configured to match the theoretical single sided driver circuit 724 and having the load contours shown in FIG. 10B. While specific values are described, it is noted that these values are merely exemplary and for purposes of illustration of the operation of the filter circuit for one particular driver circuit configuration, and a wide variety of other values are contemplated according to the principles described herein. Two circles 1502 and 1504 are shown in FIG. 15. One circle 1502, centered at Rin(XFRM)=0+0 j, defines Zin(XFRM) for an Rin(TX) variation from 0 to 1000 ohms, in 5 ohm steps, with Xin(TX)=0. The path proceeds in a counter clockwise direction as Rin(TX) increases. The radius of this circle (defined as Rd) is 16.55 ohms, selected to match the 100% efficiency theoretical contour 902 of FIG. 10B. Since the markers are for Rin(TX) 5 ohms apart, it is noted that Zin(XFRM) peaks when Zin(TX)=25+j0 Ohms. This defines the impedance transform ratio of the circuit, and can be set as desired. For variations in Rin(TX) given other values of Xin(TX), it is noted that the ratios result in circles that all pass through Zin(XFRM)=0, −16.55 j.

The second circle 1505, which is orthogonal to the first circle 1502, defines Zin(XFRM) for an Xin(TX) variation from −1000 to 1000 in 5 ohm steps, when Rin(TX) is held constant at 25 Ohms. It is centered at Zin(XFRM)=16.55−16.55 j Ohms which forces these two curves to intersect at Zin(XFRM)=16.55+0 j ohms. For variations in Xin(TX) given other values of Rin(TX), it is noted that these result in circles that pass through Zin(XFRM)=0, −16.55 j. This result is shown in FIG. 16, where Rin(TX) is varied over a wider range than specified.

Figure 16:
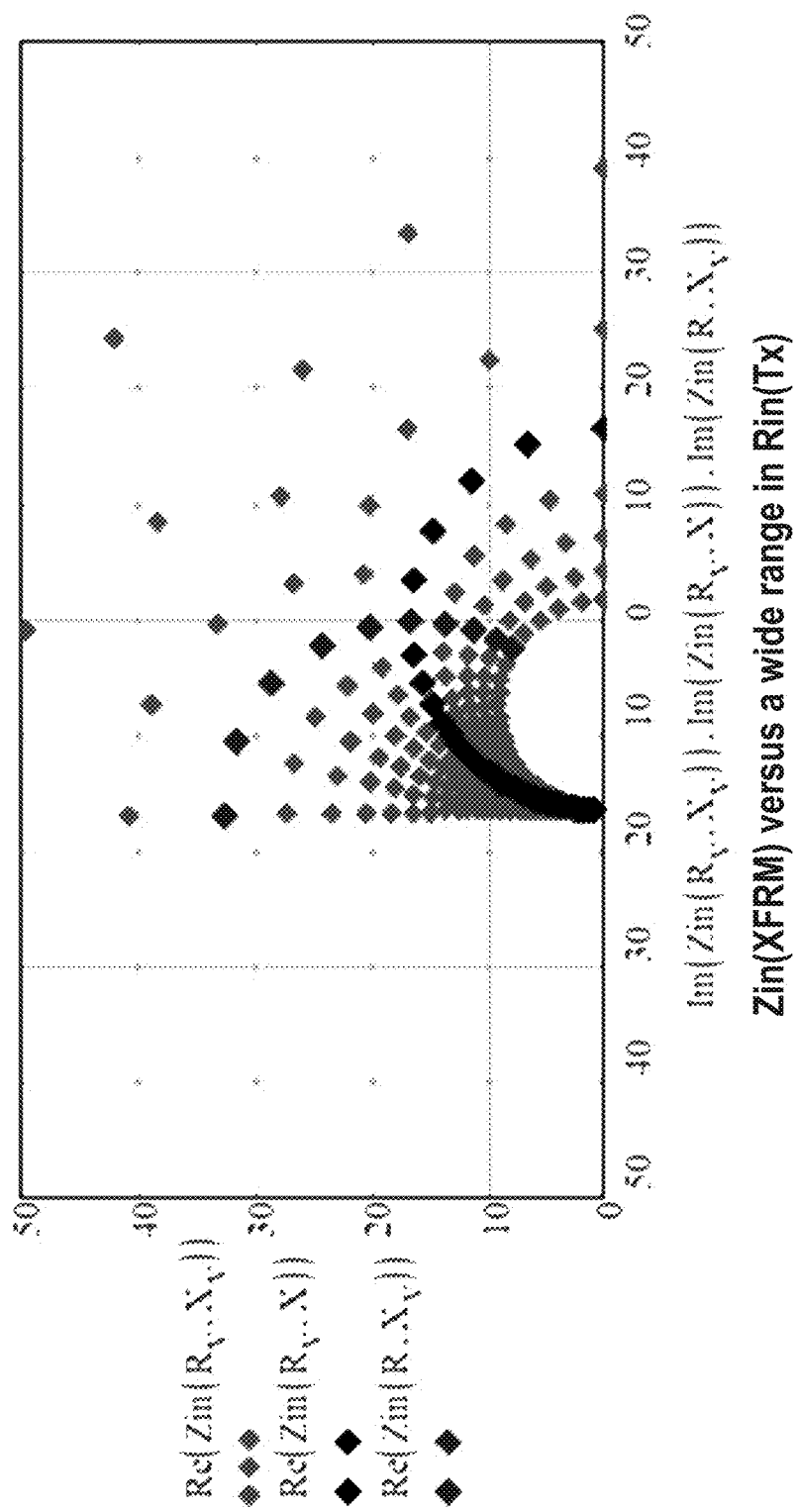
FIG. 16 is a plot showing the impedance transformed by the filter circuit over a large real range presented to the transmit circuit.

The impedance seen by the FET 1308 may be the same plot of FIG. 16 shifted to the right by the added series inductance 1308. The results shown in FIG. 16 further shows that the curves that make up Zin of the transform are independent of the transform selected. Only the mapping of Zin(XFRM) to Zin(TX) changes.

Given the observation from FIG. 12, to select the value of the series inductance 1308, it is decided where to locate the point where all the curves, as seen by the FET 1304, meet. For example, FIG. 10B shows impedances at FET 1304 to achieve 100% efficiency. In this case, Rd was 16.55 Ohms, and the theoretical intercept point is at Zin(FET)=0+7.74 j Ohms.

Figure 17:
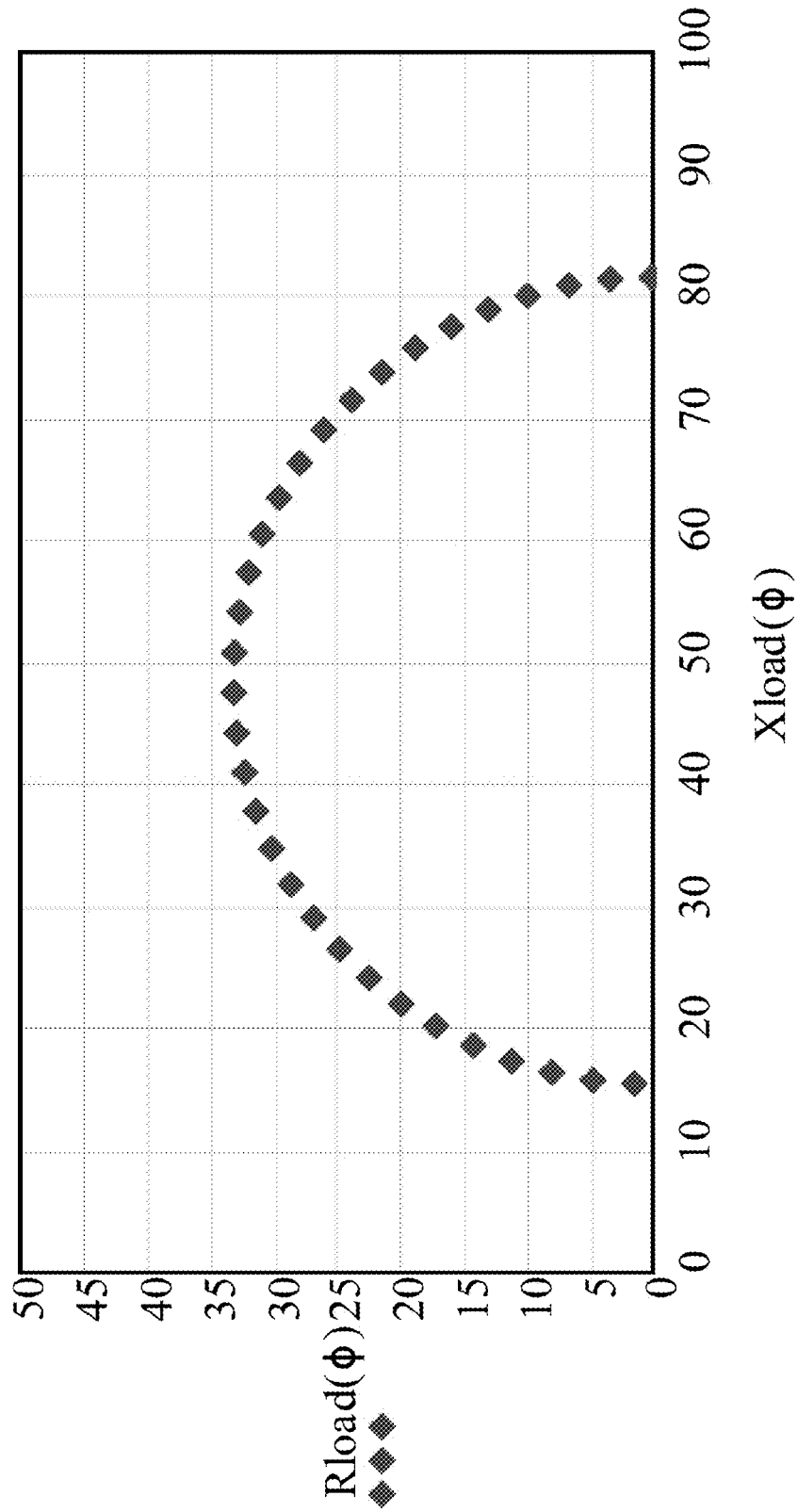
FIG. 17 is a contour plot showing the maximum efficiency of a driver circuit as a function of the real and imaginary components of the load impedance presented to the driver circuit.

FIG. 17 shows the path for an Rd equal to twice 16.55 Ohms, which would reduce the shunt capacitor 1310 on the FET 1304 also by a factor of 2. In this case the intercept is at Zload(FET)=0+15.5 j Ohms.

Figure 18:
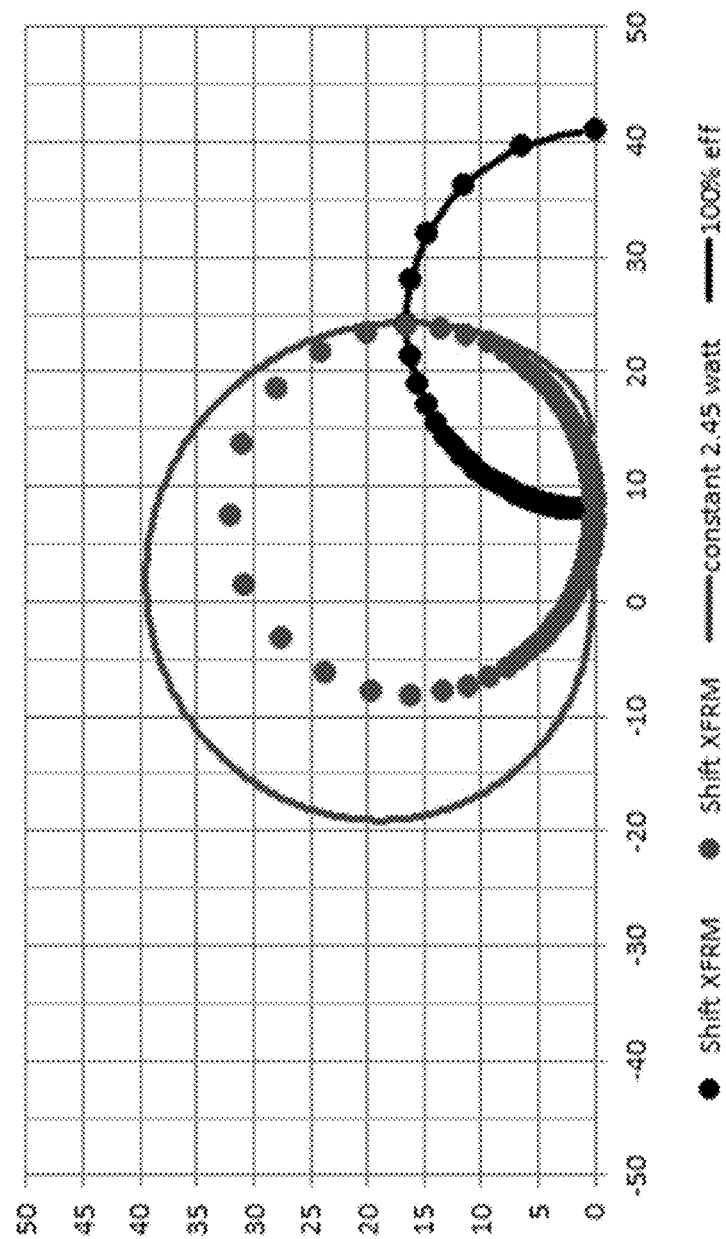
FIG. 18 is a plot showing measured impedance transformed by a filter circuit overlaid on calculated values for which power is substantially constant and efficiency is maximum.

To improve the match to the FET 1304 and thus achieve maximum efficiency as Rin(TX) varies (but only for Xin(TX)=0), a series reactance 1308 is added between the filter circuit 1602 and the FET 1304. FIG. 18 shows a final result, superimposed on the theoretical power and efficiency contours of FIG. 10B.

In an ideal result, the efficiency is 100% for all Rin(TX) when Xin(TX)=0, but the constant power contour is not a perfect fit. For Vd=10 Vdc, the power is predicted to be at a constant amount along the dotted path, and where the curves cross, but will increase for non-zero Xin(TX), since higher power regions are ever smaller circles located inside one another.

As such, FIGS. 15-18 illustrate the operation of the impedance transformation by the filter circuit 1326 having components with configured values in accordance with exemplary embodiments.

Method of Selecting Filter Circuit Components

As indicated, the components of the filter circuit 1326 are selected to perform the desired impedance transform as described above. In accordance with an embodiment, a method is provided for determining values of the components of the filter circuit 1326 that provides the described impedance transform. In one aspect, the method is derived from the relationship that defines the transform from Zin(TX) to Zin(XFRM). Zin(TX) may be defined as R+jX and Zin(XFRM) as Zin(R,X). In this form Zin(R,X) is:

$$Zin(R,X) := j \cdot X_1 + \cfrac{1}{\cfrac{1}{j \cdot X_2} + \cfrac{1}{j \cdot X_3 + (R + j \cdot X)}}$$

According to the method, two variables are used to determine the filter circuit reactances, X1 1328, X2 1330, and X3 1332. The first, variable Rd that best fits Zin(R,X) to a measured efficiency contour as R varies while X is fixed at 0 ohms. The half circle defining these values is centered at Zin(R,X)=0+j*0 and reaches a maximum of Rd at some Zin(TX)=Rin0+j*0. The variable R0, which is defined as the value of R, when X=0, that results in Zin(R0, 0)=Rd. This defines the impedance transform ratio of the filter circuit 1326, which may be done at one point, since this transform may be non-linear.

The method includes determining the efficiency and power contours vs. complex load at the FET 1304. This may be using a direct measurement to account for losses as described above. For example, exemplary contours are shown in FIGS. 11A, 11B, 12A, and 12B that could be used according to this method. Note the test results to according to the method include the capacitor 1310 that shunts the FET 1304. The total capacitance at this node may determine the maximum efficiency region.

The method further includes determining if increasing efficiency vs. real load or holding power constant vs. imaginary load is more preferable according to the particular desired operation. This sets the placement of the circles generated by the transform including X1 1328, X2 1330 and X3 1332. The series reactance 1308 needed for input shifting may be determined subsequently. The series reactance needed for output (load) shifting can be accomplished by detuning the TX coil 1314.

The method further includes selecting the half circle path radius, Rd as described above, for Zin(R,0) that will best fit the measured efficiency contours. As noted, this half circle is centered at Zin(R,X)=0+j*0 and reaches a maximum of Rd at some Zin(TX)=Rin0+j*0.

The method further includes determining the full circle path that crosses this maximum value Rd of the half circle path. This circle is orthogonal to the constant efficiency contour, and lies approximately along constant power contours. For Zin=Rin0+j*Xin, where Rin0 is fixed and Xin is variable, the resulting Zin(Rin0,Xin) will lie along this circle.

The method further includes selecting the value for R0 of the impedance where Zload will peak and is equal to Rd+0 j. From Rd and R0, the values for X1 1328, X2 1330 and X3 1332 may be determined according to the following equations.

$$x_1(R_0) := (2 \cdot R_d \cdot R_0)^{0.5} - R_d$$

$$x_2(R_0) := -(2 \cdot R_d \cdot R_0)^{0.5}$$

$$x_3(R_0) := (2 \cdot R_d \cdot R_0)^{0.5} - R_0$$

In accordance, given Rd and R0, Zin(R,X) equals:

$$Zin(R, X) := -j \cdot R_d \cdot \left[ \frac{R + j \cdot (R_0 + X)}{R - j \cdot (R_0 + X)} \right]$$

Example of Filter Circuit Configuration

Figure 19:
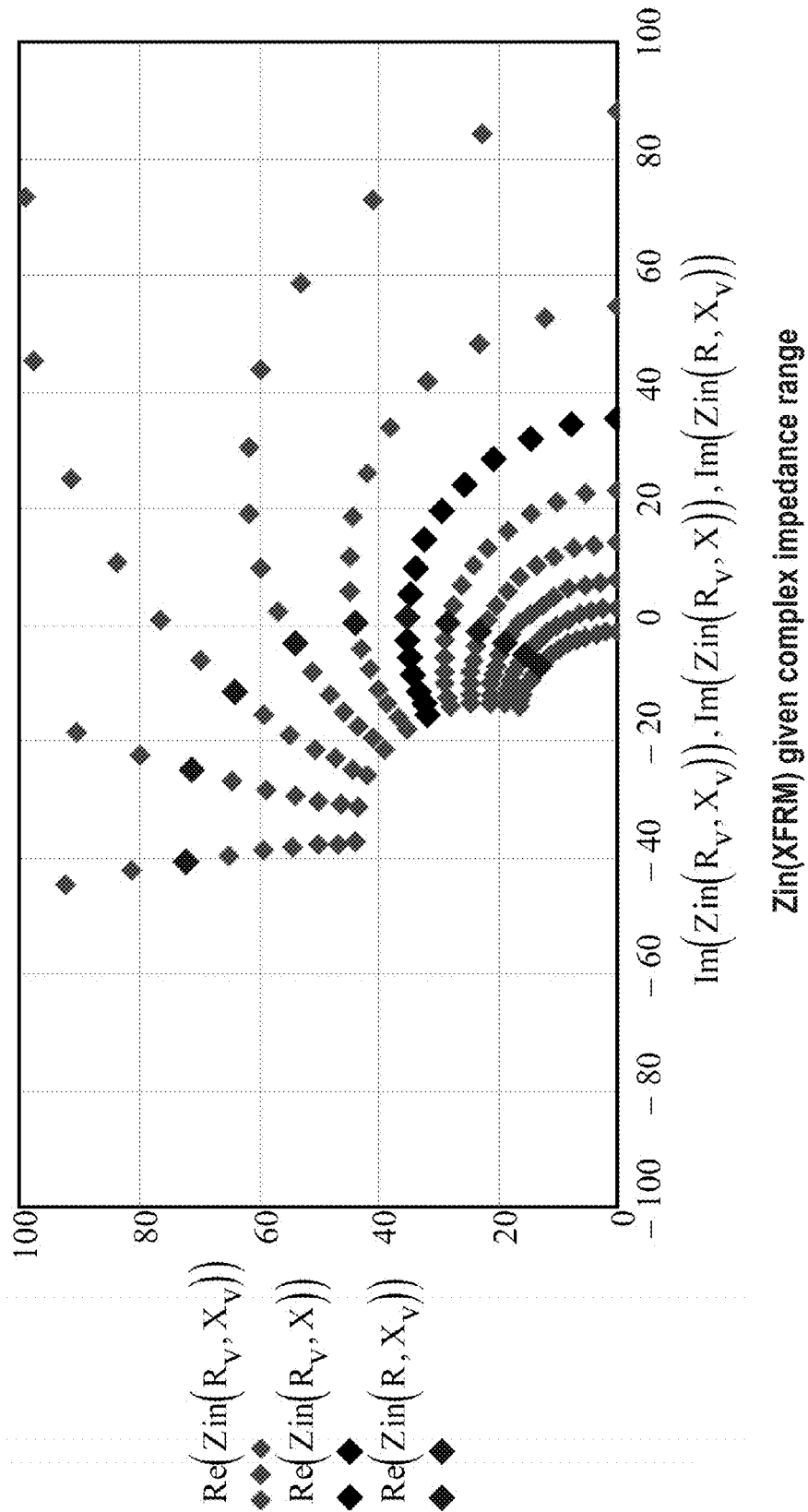
FIG. 19 is a plot showing the impedance transformed by a filter circuit when presented with a complex impedance range.
Figure 20:
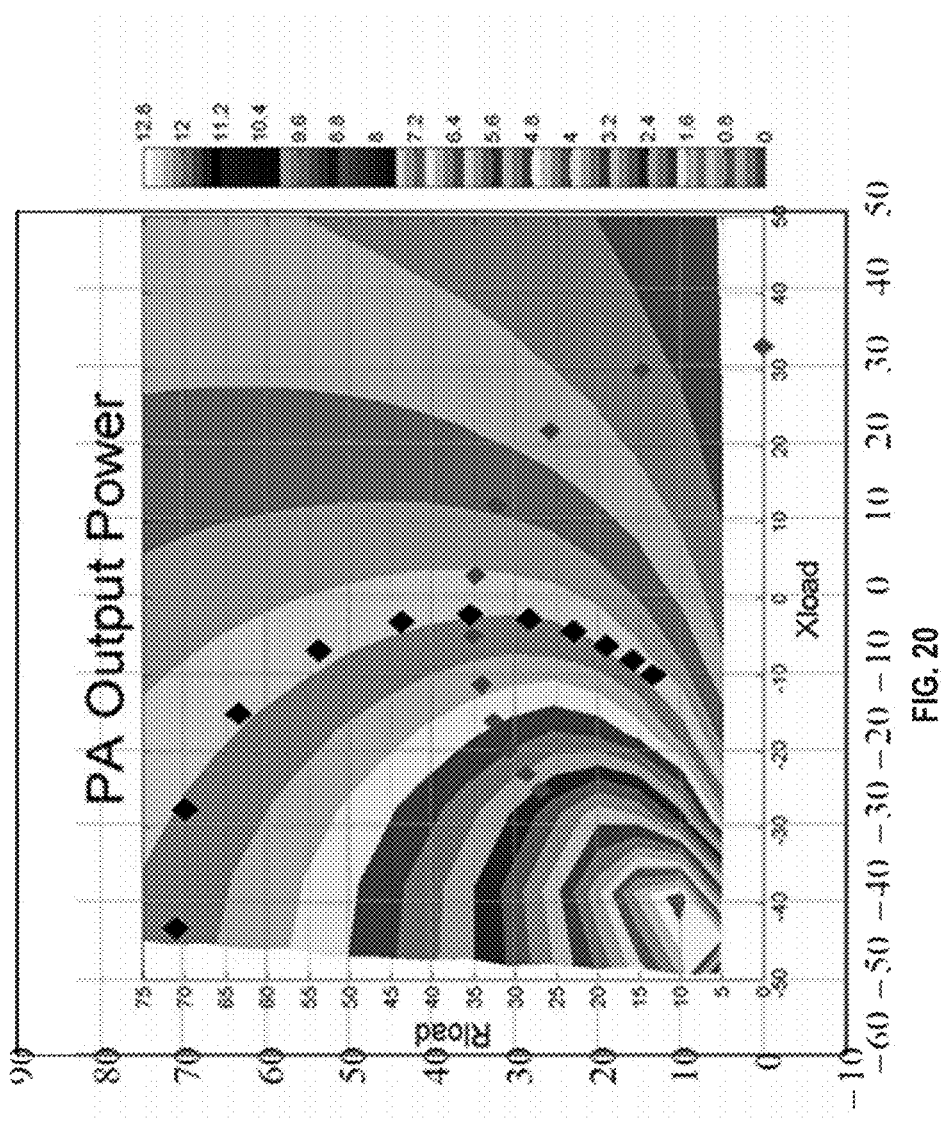
FIG. 20 shows the measured paths of a result of a filter circuit overlaid on the data of FIG. 12B.
Figure 21:
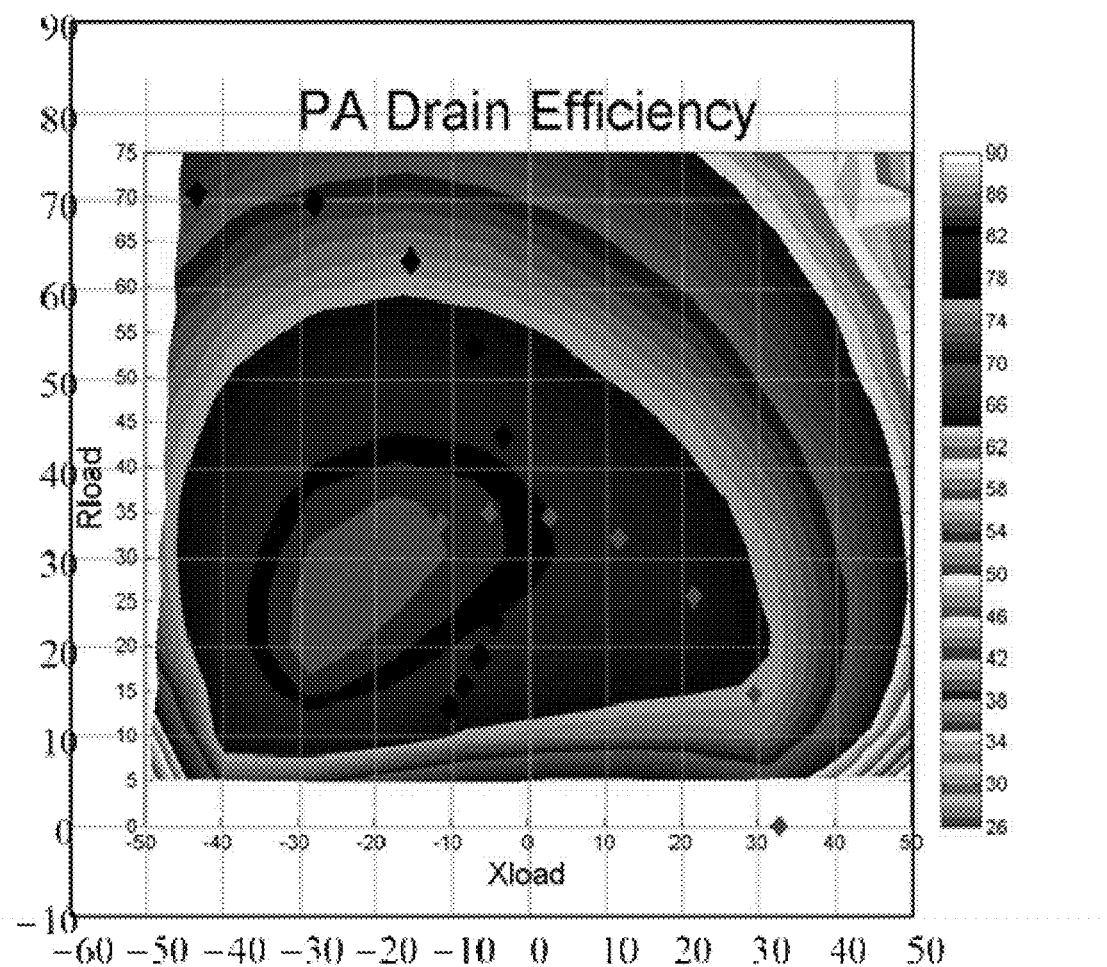
FIG. 21 shows the measured paths of a result of a filter circuit overlaid on the data of FIG. 11B.

FIGS. 19-21 show results for on exemplary filter circuit 1326 configuration in accordance with an embodiment. It is noted while specific numerical values are provided, the values are to illustrate on example of a selection of components values for a filter circuit 1326, and other values for the components may be used in accordance with the principles described herein. The values of the filter circuit 1326 are configured to provide substantially constant power over a wide range in the reactive load, X. The values are indicated as 2 times the values used for each side of the driver circuit 724 for a double-sided configuration. The values for Rd and R0 for this exemplary filter were found to be 17.6 and 23.3 respectively.

The resulting exemplary values for each single sideband transform are:

X1=11.0 Ohms, or L1=259 nH
X2=−28.6 Ohms, or C2=820 pf
X3=5.4 Ohms, or L3=125 nH For the FET 1308, the value for Cshunt 1310 is selected as 2*287 pf. This includes each FET capacitance, estimated at 80 pf. For the filter circuit 1326 it was determined to maximize the fit to the constant power curves, for example as in FIGS. 12A and 12B. This results in an offset from the maximum efficiency path and this fit comes by adding a series inductance 1308. From FIGS. 11A and 11B, the choice for the circle radius is 35.2 ohms. The resulting FET load paths peaks at Rin(TX)=46.6 ohms, as desired.

The resulting transformed impedance for a double sided filter circuit 1326 over the specified Zin(TX) load range is shown in FIG. 19. The transformed impedance is then shifted to align with the desired FET load, by Lseries 1308 of 2*516 nH. The double sided filter circuit 1326 includes of a 2*820 nH series inductance, an 820/2 pf shunt capacitor and a 2*25 nH series inductance. This final series inductor can be realized simply by off-tuning the TX coil 1314 by +10.6 ohms.

It is noted that "straight line" impedances corresponding to variations in the real impedance for a particular reactance are transformed into orthogonal circles. This will be true for any filter circuit 1326 as shown in FIG. 13. Furthermore, it is noted that Zin(XFRM) given Zin(TX)=Rin(TX)+0*j. For this result, Rin(TX) varies as 0, 5, . . . 75 ohms Ideally Zin(ZFRM) reaches a peak of 35.2 ohms, with X=0 when Rin(TX)=45 ohms. In addition, the peak value and location of Rin(XFRM) changes as Xin(TX) changes. This is why the transform is designed with Xin(TX)=0. Furthermore, the transform with Zin(TX)=45 ohms+j Xin(TX). Xin(TX) varies as −50, −40 . . . 50 ohms. Other points of FIG. 19 show all possible points that can be outcomes given the specified range of Zin(TX).

In order to overlay the transform prediction on the data of FIGS. 11A, 11B, 11C, and 11D, the transform of FIG. 19 may be shifted to match the measured results from the load box. There are two reactive shifts involved. The first shift is to add two series reactances between the FETs and their filter circuits (for double-sided configuration). This added reactance (Xshift) is combined with X1 1328 of the filter circuit 1326 so that the total series inductance on each side is about 820 nH.

The second shift is to remove the two 600 nH series inductances used to test the driver circuit without any transform. After these shifts, the transformed paths can be overlaid on the power and efficiency contours measured for the FETs alone.

FIG. 20 shows the paths of the filter circuit 1326 for this example overlaid on the measured data of FIG. 12B. As before, the half circle is for fixed X=0, and variable R, and the full circle is with fixed Rin(TX)=45 ohms and variable X. As can be seen the power vs. X contour is expected to be rather constant, while the power vs. variable R keeps increasing with R. It is noted that the power where the lines cross can be seen to be about 1.3 Watts, delivered into a Rload(FET) of 35 ohms with Vd=5.5 Volts. By increasing Vd to 10 Volts, this power should increase to about 4.3 Watts.

FIG. 21 shows the paths of the filter circuit 1326 for this example overlaid on the measured data of FIG. 11B. As before, the half circle is for fixed X, and variable R, and the full circle is with fixed R and variable X. As can be seen, the efficiency is not at the maximum for Rload=46, Xload=0. The maximum occurs around Rload=30, Xload=−20, which does lie on the path of increasing Rin(TX).

It is noted that in addition to fitting the power and efficiency contours, the methods described herein may allow to set the impedance ratio of the transformer.

In addition to the systems and methods disclosed herein above, attached is one appendix: Appendix A. Appendix A is in 20 (twenty) pages describing various configurations of a filter circuit 1326 that may be used by one or more of the methods and systems disclosed herein. While the appendix may illustrate filter circuits having particular component values, it is noted that the values are provided for illustration of the operation and performance of the impedance transform and that the component values for other embodiments selected according to the principles described herein may vary widely.

Further design characteristics of the driver circuit 1324 that may be used may include the driver circuit characteristic impedance, input voltage, and series reactance. In accordance with some embodiments, a variety of characteristics of the filter circuit 1326 may be chosen to arrive at a desired impedance transformation that may be correlated with the high efficiency curve 902 and power contour. Characteristics of the filter circuit 1326 may include the number of desired poles, the type of filter circuit, or a number of stacked filter circuits. The filter circuit 1326 may be a ladder network of reactive elements that may take a variety of forms. For example, the ladder network may comprise multiple reactive stages (i.e., reactive circuits) each including a combination of reactive components. Any of single value or multiple values of the ladder network may be adjusted based on a desired response. Some filter circuits may be less desirable such as a filter circuit 1326 that creates a simple reactance shift regardless of the characteristic impedance chosen. The ladder network may also include—more than three reactive elements, in which case all these elements may be varied using a common parameter. Using multiple elements can greatly reduce harmonics. However, it some cases it may be desirable to reduce the number of components for the filter circuit, for example, as described above with reference to FIG. 14.

Furthermore, as described above, the prototype class, the type of filter, the cutoff frequency, and the characteristic impedance of the filter circuit 1326 may also be configured to achieve a desired impedance response that can be used. The prototype class may indicate how the component values are chosen based on the other parameters. The type of filter circuit 1326 can be a low pass, high pass, band pass, notch, or combination thereof. The cutoff frequency may be a 3 dB attenuation point, although the cutoff frequency may vary depending on the prototype class. The characteristic impedance may be the target real impedance of the filter circuit 1326 if this were being used in a single impedance circuit (e.g., a 500 RF circuit).

According to one embodiment, given a set of several of these characteristics (e.g., selecting the driver circuit design and driver circuit filter series reactance 1108), non-selected characteristics (e.g., a filter circuit 1326 design) may be derived that allows the system to perform an impedance transformation of a range of real and reactive load impedances that transforms the real and reactive load impedance to a value for which the driver circuit 1324 is highly efficient and for which power is constant.

Another method may include applying the reverse transformation of the series reactance and ladder network (i.e., filter circuit 1326) to the high efficiency curve 902 and constant power.

As indicated herein, the driver circuit 1324 may behave as an ideal AC current source (with a source impedance above some ratio of the maximum real load) that supplies a constant current for a range of impedances regardless of the impedance in that range presented to the driver circuit 1324. The particular constant current may be chosen based on the combinations of characteristics used. As such, the wireless power transmitter 404 may be able to source more power as the resistance (i.e., real impedance) increases.

Once the component values of the filter circuit 1326 has been determined, if the elements of the filter circuits are altered with different impedance values, the impedance transformation might not result in the desired impedances for which the driver circuit 1326 is efficient and for achieving constant power. For example, an "undesirable" transformation may result from using low tolerance components, for example, components which could vary 20 percent. In this filter design, while using similar components, a change in impedance value can fail to result in impedance transformation that allows for the driver circuit 1324 to be efficient when a variety of complex impedances are presented to the driver circuit 1324 by the transmit circuit 1350.

According to the configuration of the filter circuit, the values of the impedances of the various elements are particularly chosen in such a manner to achieve the desired transformation as described above. Altering these impedance values for any given element, even by 5%, results in a significantly different impedance transformation. As such, the given impedance transformation as described above that results in maintaining the driver circuit 1124 at a high efficiency (e.g., within 20% of the maximum efficiency) is achieved after careful selection of impedance values for the filter elements according to the principles described herein.

Figure 22:
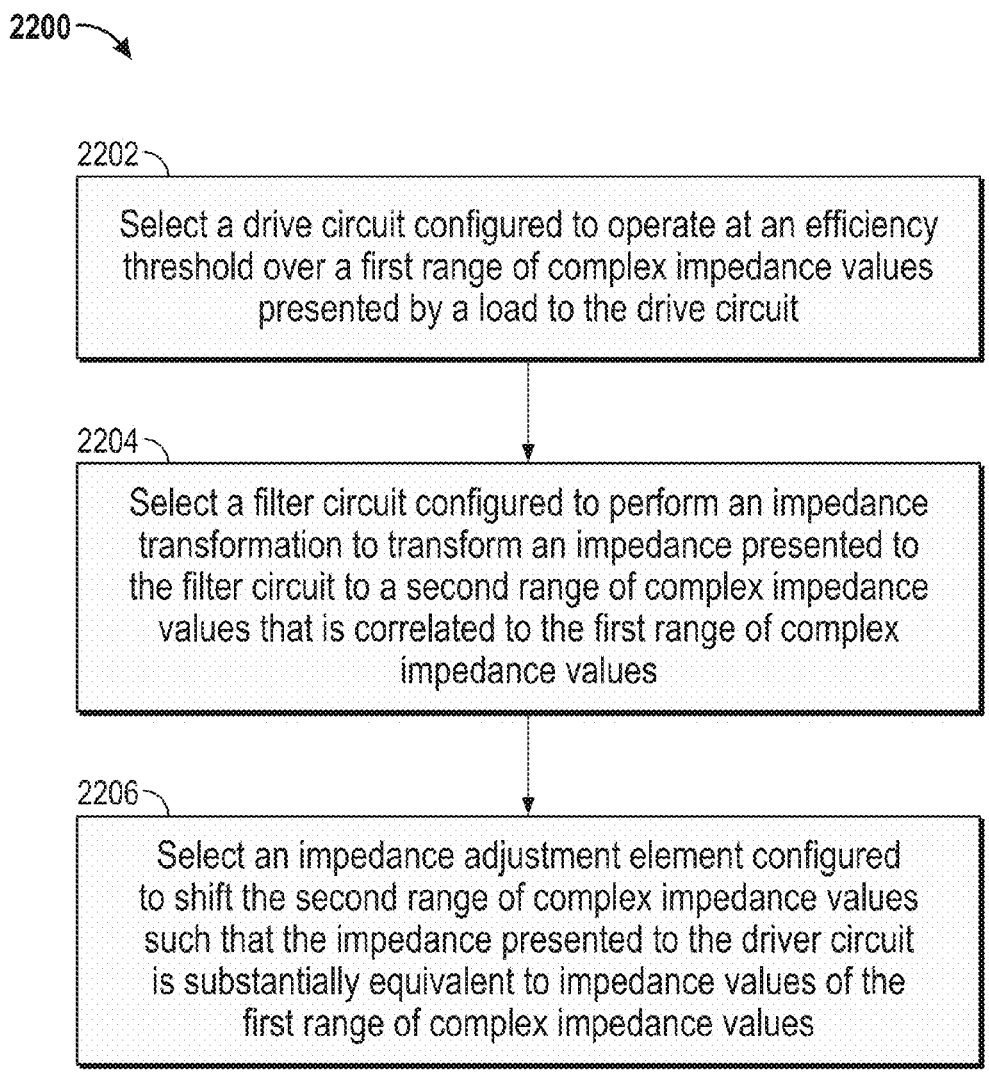
FIG. 22 is a flowchart of an exemplary method for designing a highly efficient transmit circuit.

FIG. 22 is a flowchart of an exemplary method for designing a highly efficient transmit circuit. The transmit circuitry may be configured for wirelessly outputting power to charge or power a receiver device. In block 2202, a driver circuit 1324 may be selected that is configured to operate at an efficiency threshold over a first range of complex impedance values presented by a load to the driver circuit 1324. Based on the characteristics chosen, in block 2204, a filter circuit 1326 may be selected that is configured to perform an impedance transformation to transform an impedance presented to the filter circuit 1326 to a second range of complex impedance values that is correlated to the first range of complex impedance values. In block 2206, an impedance adjustment element 1308 may be selected that is configured to shift the second range of complex impedance values such that the impedance presented to the driver circuit 1324 is substantially equivalent to impedance values of the first range of complex impedance values.

It should be further appreciated that the filter circuit 1326 may be configured to transform impedance values for other types of loads other than a transmit circuit 1350 and thus principles of various embodiments may be practice with a wide variety of loads. As such, embodiments described herein are not limited to providing wireless power, and exemplary embodiments in accordance with the invention may be applied in other situations where a driver circuit 1324 may drive a variable load of any type having a range of impedance values. In some embodiments, the transmit circuit 1350 may include a transmit coil (or loop antenna) configured to resonate at a frequency of the signal provided by the driver circuit 1350. The transmit circuit 1350 may be configured to wirelessly output power to charge or power a receiver 608a, 608b, and/or 608c as described above. The transmit circuit 1350 may further be configured to wirelessly transmit power to a plurality of receivers 608a, 608b, and 608c. Each of the receivers 608a, 608b, and 608c may alter the impedance seen by the transmit circuit 1350 such that the transmit circuit 1350 may include a wide range of complex impedance values that may be transformed by the filter circuit 1326. The filter circuit 1326 may transform the impedance value into a value that has a non-zero reactance such that it is a complex impedance value with a real portion corresponding to resistance and an imaginary portion corresponding to a reactance.

In some embodiments, the filter circuit 1326 may be a passive circuit and may not require added logic or control signals to operate. The filter circuit 1326 may be a low pass filter circuit 1324. It should be appreciated that a wide variety of filter circuit configurations may be used in accordance with exemplary embodiments and may be selected as described according to the principles herein.

The amount of power provided by the driver circuit 1324 may be configured to increase as an amount of the resistive portion of the impedance seen by the driver circuit 1324 increases. This may allow for continually delivering higher power while maintaining efficiency as more wireless power receivers 608a, 608b, and 608c receive power from the transmit circuit 1350. Furthermore, the filter circuit 1326 may allow such that a magnitude of the impedance seen by driver circuit 1324 at which maximum power may be provided is higher than the magnitude of the impedance seen by the driver circuit 1324 at which maximum efficiency of the driver circuit 1324 is provided. As such, the driver circuit 1324 may perform as a constant current source over a range of resistances (i.e., real impedance values). As described above, the driver circuit 1324 may be a class E amplifier or other amplifier such as switching amplifier. The driver circuit 1324 may include other types of amplifiers as described above. Of note, however, in certain embodiments a class D circuit would act like a voltage source.

It should be further appreciated that while shown as a filter circuit 1326, other types of circuits, components, or modules may be used to perform the type of impedance transformation as described above to transform a range of impedance values into a complex value for which a driver circuit 1324 is highly efficient, in accordance with the principles described herein.

As described with reference to FIG. 13, one of the functions of the filter circuit 1326 is to remove unwanted harmonics produced by the driver circuit 1324. In one aspect, the harmonics may result in undesired emissions from the transmit circuit 1350. As such, the filter circuit 1326 may be configured to reduce emissions from the transmit circuit 1350 to reduce emissions to meet spectral emission requirements as well as perform the impedance transformation as described above. For example, as described above, the filter circuit 1326 may be a low pass filter that is seventh order capable to reject radiated emissions and conducted emissions of the transmit circuit 1350 and reduce coupling from a receiver to the transmitter. In one embodiment, the filter circuit 1326 may be configured to reduce/reject radiated emissions and conducted emissions of the transmitter between substantially 20-250 MHz. It should be appreciated that the filter circuit 1326 may further be configured to reject emissions in other frequency ranges according to different applications and power requirements or different operating frequencies.

Figure 23:
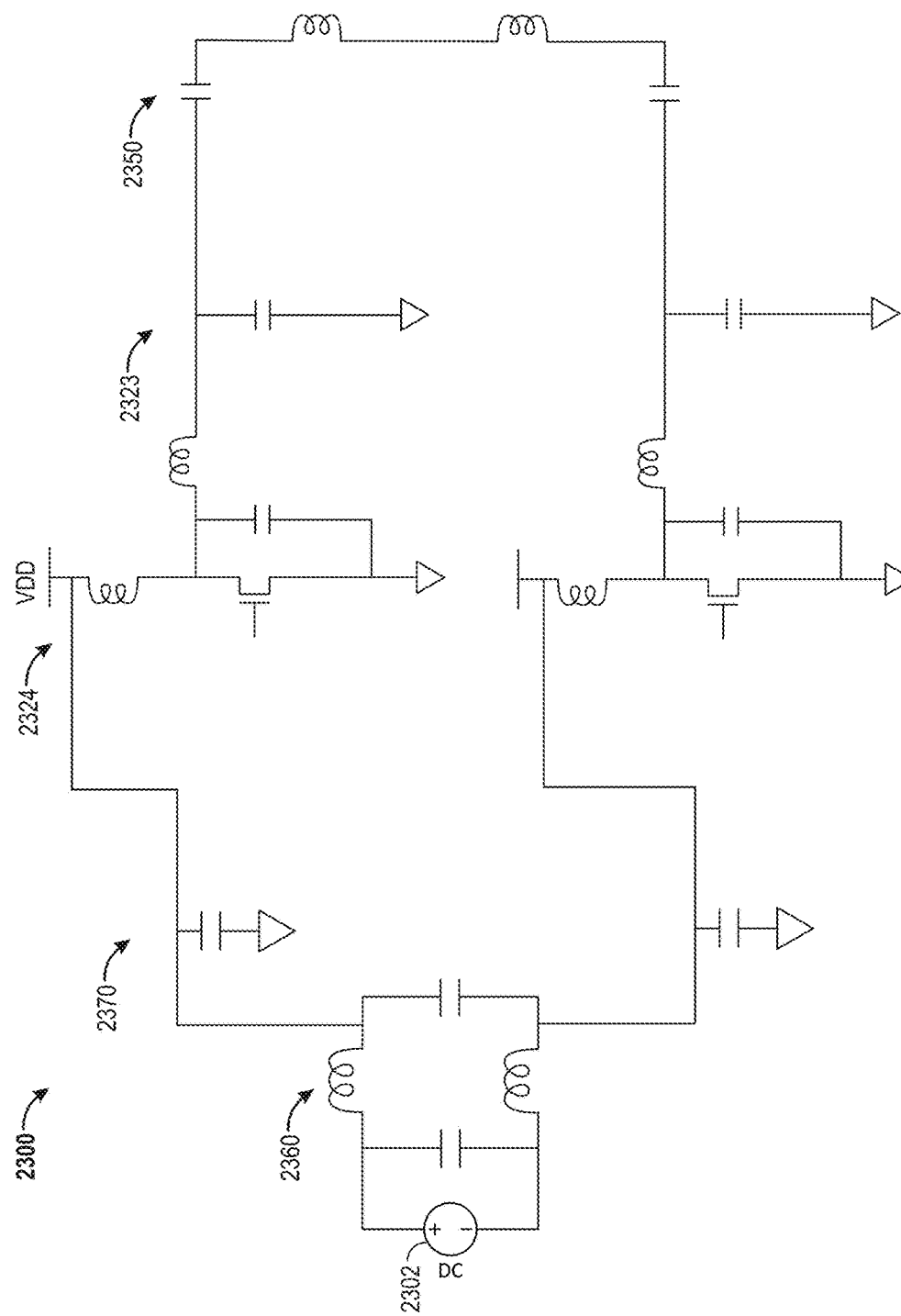
FIG. 23 is another schematic diagram of portion of transmit circuitry, in accordance with an exemplary embodiment of the invention.

FIG. 23 is another schematic diagram of portion of transmit circuitry 2300, in accordance with an exemplary embodiment. The transmit circuitry 2300 shows an example comprises dual driver circuits 2324 in addition to other components for reduction of emissions. As shown, a first filter circuit 2360 and a bypass capacitor 2370 configured to reduce emissions from the driver circuit 2324 and the transmit circuit 2350 to the power source 2302 are included. In some embodiments, the transmit circuitry 2300 can include a shunt capacitor on $V_{DD}$. The inductors at 2360 may be a common mode choke. The driver circuit 2324 includes dual class E amplifiers 2324 which drive the transmit circuit 2350 via a third filter circuit 2323 as shown. The third filter circuit 2323 (dual filter circuits) is configured perform the impedance transformation as described above. The third filter circuit 2323 can be further configured to reduce emissions of the transmit circuit 2350, as described above.

Figure 24:
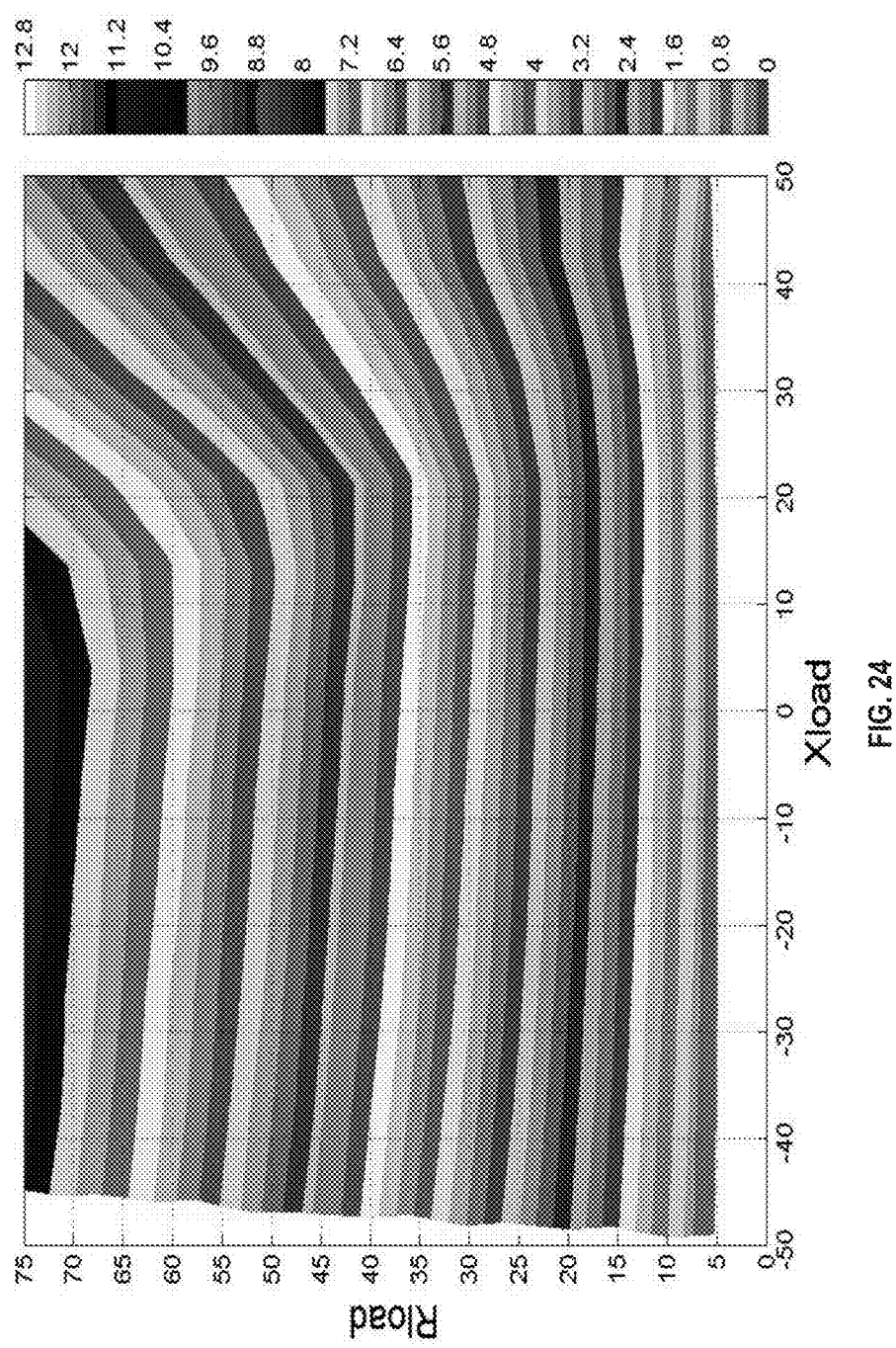
FIG. 24 shows measured results for power output from a driver circuit as in FIG. 13 as a function of real and imaginary components of the load impedance presented to the driver circuit.

FIG. 24 shows measured results for power output a driver circuit 1324 as in FIG. 13 as a function of real and imaginary components of the load impedance presented to the driver circuit 1324. The measured results show power contours as described above and when the impedance Zload(XFRM) is presented to the driver circuit 1324. As shown, the power output is approximately independent of Xload, while increasing vs. Rload at any Xload.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations. For example, means of transmitting may include a transmit circuit. Means for driving may include a driver circuit. Means for filtering may comprise a filter circuit.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. An exemplary storage medium is coupled to the processor such that the processor may read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer readable medium. Computer readable media includes both computer storage media and communication media including any medium that facilitates transfer of a computer program from one place to another. A storage media may be any available media that may be accessed by a computer. By way of example, and not limitation, such computer readable media may comprise RAM, ROM, EEPROM, CD ROM or other optical disk storage, magnetic disk storage or other magnetic storage devices, or any other medium that may be used to carry or store desired program code in the form of instructions or data structures and that may be accessed by a computer. Also, any connection is properly termed a computer readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A transmitter device, comprising:
a driver circuit characterized by an efficiency, the driver circuit electrically connected to a transmit circuit having an impedance, the impedance of the transmit circuit within a complex impedance range including resistive and reactive variations, the complex impedance range defined by a minimum real impedance value, and a maximum real impedance, a ratio between the minimum and maximum real impedance value being at least two to one; and
a filter circuit electrically connected to the driver circuit and configured to modify the impedance of the transmit circuit to maintain the efficiency of the driver circuit at a level that is within 20% of a maximum efficiency of the driver circuit when the impedance is within the complex impedance range, the filter circuit further configured to maintain a substantially constant power output level irrespective of the reactive variations within the complex impedance range.

2. The transmitter device of claim 1, wherein the ratio is one of at least five to one and at least ten to one.

3. The transmitter device of claim 2, wherein the minimum real impedance value comprises 8 ohms and the maximum real impedance value comprises 80 ohms.

4. The transmitter device of claim 1, wherein the ratio is a first ratio, wherein the range is further defined by a first imaginary impedance value and a second imaginary impedance value, wherein a second ratio of a first magnitude of a difference between the first imaginary impedance and the second imaginary impedance value to a second magnitude of a difference between the minimum real impedance value and the maximum real impedance value is substantially equal to at least one of one to two, two to three, one to one, three to two, and two to one.

5. The transmitter device of claim 4, wherein the minimum real impedance value is substantially four ohms, wherein the maximum real impedance value is substantially forty ohms, wherein the first imaginary impedance value is substantially negative four ohms, and wherein the second imaginary impedance value is substantially 50 ohms.

6. The transmitter device of claim 1, wherein the transmit circuit comprises a transmit coil electrically connected to the output of the filter circuit, the transmit coil configured to wirelessly transmit power to charge or power a receiver device.

7. The transmitter device of claim 1, wherein the transmit circuit is configured to wirelessly transmit power to charge or power a plurality of receiver devices, wherein each of the plurality of receiver devices is configured to cause a change in the impedance when positioned to wirelessly receive power from the transmit circuit.

8. The transmitter device of claim 1, wherein the driver circuit comprises a class E amplifier circuit.

9. The transmitter device of claim 1, wherein the impedance of the transmit circuit comprises a reactance that is substantially zero before the impedance is modified.

10. A method of adjusting an impedance of a driver circuit characterized by an efficiency, the driver circuit electrically connected to a transmit circuit having an impedance, the impedance of the transmit circuit within a complex impedance range including resistive and reactive variations, the complex impedance range defined by a minimum real impedance value and a maximum real impedance, a ratio between the minimum and maximum real impedance value being at least two to one, the method comprising:
modifying the impedance to maintain the efficiency of the driver circuit at a level that is within 20% of a maximum efficiency of the driver circuit when the impedance is within the complex impedance range, and to maintain a substantially constant power output level irrespective of the reactive variations within the complex impedance range.

11. The method of claim 10, wherein a value of the modified impedance comprises a complex value comprising a real part corresponding to a resistance value and an imaginary part corresponding to a non-zero reactance value.

12. The method of claim 10, wherein modifying comprises modifying using a filter circuit comprising at least one of a low pass filter, a high pass filter, or any combination thereof.

13. The method of claim 12, wherein the low pass filter comprises a 3-pole Butterworth filter with a 3 dB bandwidth of an operating frequency of the driver circuit.

14. The method of claim 12, wherein a cutoff frequency of the filter circuit is higher or lower than an operating frequency of the driver circuit.

15. The method of claim 10, further comprising substantially removing harmonic components of the signal generated by the driver circuit operating at an operating frequency.

16. The method of claim 10, wherein an amount of power provided to the transmit circuit increases as an amount of a resistive portion of the impedance increases.

17. The method of claim 10, wherein a first magnitude of the impedance at which a maximum power amount is output by the driver circuit is higher than a second magnitude of the impedance at which maximum efficiency of the driver circuit is provided.

18. The method of claim 10, wherein modifying the impedance comprises modifying using a filter circuit comprising a ladder network of reactive circuits, each of the reactive circuits comprising a combination of reactive components.

19. The transmitter device of claim 10, wherein modifying comprises modifying using a filter circuit and an impedance adjustment element configured to cause a reactive shift of a transformed impedance produced by the filter circuit.

20. A transmitter device, comprising:
means for driving characterized by an efficiency, the means for driving electrically connected to a transmit circuit having an impedance, the impedance of the transmit circuit within a complex impedance range including resistive and reactive variations, the complex impedance range defined by a minimum real impedance value, and a maximum real impedance, a ratio between the minimum and maximum real impedance value being at least two to one; and means for filtering electrically connected to the means for driving and configured to modify the impedance to maintain the efficiency of the driving means at a level that is within 20% of a maximum efficiency of the driving means when the impedance is within the complex impedance range, the means for filtering further configured to maintain a substantially constant power output level irrespective of the reactive variations within the complex impedance range.

21. An apparatus for wirelessly transmitting power, comprising:
a transmit circuit characterized by a first impedance and configured to generate a magnetic field for wirelessly transferring power to one or more receiver devices to power or charge respective loads of the one or more receiver devices positioned within the magnetic field, the first impedance varying over a first range in response at least in part to changes in a number of the one or more receiver devices positioned within the magnetic field;
a driver circuit configured to drive the transmit circuit with a time-varying signal to cause the transmit circuit to generate the magnetic field;
a passive filter circuit comprising one or more reactive components having respective reactance values selected to transform the first impedance presented to the passive filter circuit by the transmit circuit within the first range to a second impedance presented to the driver circuit by the passive filter circuit that has a complex impedance value that is within a second range of complex impedance values corresponding to a range of complex impedance values that maintains an efficiency level of the driver circuit above a threshold efficiency value, the passive filter circuit further configured to maintain a substantially constant power output level irrespective of the reactive variations within the complex impedance range.

22. The apparatus of claim 21, wherein the threshold efficiency value corresponds to an efficiency level that is within 20% of a maximum efficiency of the driver circuit.

23. The apparatus of claim 21, wherein the first range corresponds to a range of real impedance values between 8 ohms and 80 ohms.

24. The apparatus of claim 21, wherein the first range corresponds to a range of complex impedance having a real impedance range between four ohms and forty ohms and an imaginary impedance range between negative 4j ohms and substantially 50j ohms.

25. The apparatus of claim 21, wherein the driver circuit comprises a class E amplifier circuit.

26. The apparatus of claim 21, wherein the complex impedance value comprises a real part corresponding to a resistance value and an imaginary part corresponding to a non-zero reactance value.

27. The apparatus of claim 21, wherein the passive filter circuit comprises a 3-pole Butterworth filter with a 3 dB bandwidth of an operating frequency of the driver circuit.

28. The apparatus of claim 21, wherein the passive filter circuit is further configured to substantially remove harmonic components of a signal generated by the driver circuit operating at an operating frequency.

29. The apparatus of claim 21, further comprising an impedance adjustment element configured to cause a reactive shift between the driver circuit and the passive filter circuit.

* * * * *